(12) United States Patent
Tsuchida et al.

(10) Patent No.: US 7,754,589 B2
(45) Date of Patent: Jul. 13, 2010

(54) METHOD FOR IMPROVING THE QUALITY OF A SIC CRYSTAL

(75) Inventors: Hidekazu Tsuchida, Yokosuka (JP); Liutauras Storasta, Yokosuka (JP)

(73) Assignee: Central Research Institute of Electric Power Industry, Tokyo (JP)

( * ) Notice: Subject to any disclaimer, the term of this patent is extended or adjusted under 35 U.S.C. 154(b) by 102 days.

(21) Appl. No.: 12/251,590

(22) Filed: Oct. 15, 2008

(65) Prior Publication Data

US 2009/0047772 A1   Feb. 19, 2009

Related U.S. Application Data

(62) Division of application No. 11/595,232, filed on Nov. 10, 2006.

(30) Foreign Application Priority Data

Jul. 28, 2006 (JP) ............................. 2006-206953
Sep. 1, 2006  (JP) ............................. 2006-237996

(51) Int. Cl.
    *H01L 21/265* (2006.01)
(52) U.S. Cl. ...................................... 438/518; 438/528
(58) Field of Classification Search ................. 438/510, 438/512, 518, 528, 530, 473, 483
    See application file for complete search history.

(56) References Cited

U.S. PATENT DOCUMENTS

| 3,710,203 A | 1/1973 | Stahr et al. |
| 5,328,855 A | 7/1994 | Kitabatake et al. |
| 5,543,637 A | 8/1996 | Baliga |
| 5,681,762 A | 10/1997 | Baliga |
| 5,994,208 A | 11/1999 | Prins |
| 6,043,139 A | 3/2000 | Eaglesham et al. |

(Continued)

FOREIGN PATENT DOCUMENTS

EP    0209257 A1    1/1987

(Continued)

OTHER PUBLICATIONS

Zhang, J. et al., "Electrically active defects in n-type 4H-silicon carbide grown in a vertical hot-wall reactor", Journal of Applied Physics, Apr. 15, 2003, vol. 93, No. 8, pp. 4708-4714, American Institute of Physics.

(Continued)

*Primary Examiner*—Savitri Mulpuri
(74) *Attorney, Agent, or Firm*—The Webb Law Firm

(57) ABSTRACT

A method for improving the quality of a SiC layer by effectively reducing or eliminating the carrier trapping centers in the as-grown SiC crystal. The method includes the steps of: (a) carrying out ion implantation of carbon atoms, silicon atoms, hydrogen atoms, or helium atoms into a shallow surface layer of the SiC crystal layer to introduce carbon interstitials into the surface layer, and (b) growing the SiC layer upward from the edge face of the surface layer into which the carbon interstitials have been introduced, and diffusing out the carbon interstitials that have been introduced into the surface layer from the surface layer into the grown layer and combining the carbon interstitials and point defects to make the electrically active point defects in the grown layer inactive.

9 Claims, 15 Drawing Sheets

U.S. PATENT DOCUMENTS

| | | |
|---|---|---|
| 6,703,294 B1 | 3/2004 | Schoner et al. |
| 2004/0144301 A1 | 7/2004 | Neudeck et al. |
| 2005/0082542 A1 | 4/2005 | Sumakeris et al. |
| 2005/0106824 A1 | 5/2005 | Alberto et al. |

FOREIGN PATENT DOCUMENTS

EP            0750058 A2    12/1996

OTHER PUBLICATIONS

Klein, P.B. et al., "Lifetime-limiting defects in n-4H-SiC epilayers", Applied Physics Letters 88, Jan. 30, 2006, pp. 052110-1 to 052110-3, American Institute of Physics.

Kimoto, Tsunenobu et al., "Reduction of doping and trap concentrations in 4H-SiC epitaxial layers grown by chemical vapor deposition", Applied Physics Letters, Oct. 22, 2001, vol. 79, No. 17, pp. 2761-2763, American Institute of Physics.

Negoro, Y. et al., "Stability of deep centers in 4H-SiC epitaxial layers during thermal annealing", Applied Physics Letters, vol. 85, No. 10, Sep. 6, 2004, pp. 1716-1718, American Institute of Physics.

Storasta, L. et al., "Deep levels created by low energy electron irradiation in 4H-SiC", Journal of Applied Physics, Nov. 1, 2004, vol. 96, No. 9, pp. 4909-4915, American Institute of Physics.

Storasta, Liutauras et al., "Reduction of traps and improvement of carrier lifetime in 4H-SiC epilayers by ion implantation", Applied Physics Letters, 2007, vol. 90, pp. 062116-1 to 062116-3, American Institute of Physics.

Storasta, Liutauras et al., "Enhanced annealing of the Z 1/2 defect in 4H-SiC epilayers", Journal of Applied Physics, 2008, vol. 103, pp. 013705-1 to 013705-7, American Institute of Physics.

Repeat of n times

METHOD FOR IMPROVING THE QUALITY OF A SIC CRYSTAL

CROSS REFERENCE TO RELATED APPLICATIONS

This application is a division of co-pending U.S. patent application Ser. No. 11/595,232 filed Nov. 10, 2006, entitled "Method for Improving the Quality of an SiC Crystal and an SiC Semiconductor Device", and relates to co-pending U.S. patent application Ser. No. 12/250,558 filed Oct. 14, 2008, entitled "SiC Crystal Semiconductor Device", which is also a division of parent application Ser. No. 11/595,232, both of which are incorporated herein by reference in their entirety.

BACKGROUND OF THE INVENTION

1. Field of the Invention

The present invention relates to a method for improving the quality of a crystal layer of SiC after the growth thereof. This invention also relates to a semiconductor device produced by carrying out such a method.

2. Description of the Related Art

FIG. 19 is a schematic view showing the atomic arrangement of Si and C in the perfect 4H—SiC crystal. The crystal lattices of semiconductors are not perfect even in the case where they do not contain any impurities, some amount of vacancies and interstitials is always present to maintain the thermodynamic equilibrium. As shown in FIG. 20, the point defects in a compound semiconductor can be classified as follows:

a) a vacancy: in the case where an atom is removed from its site;

b) an interstitial: in the case where an atom occupies a site different from a regular. In the case where an interstitial is of the same species as the host lattice, it is called self-interstitial. Otherwise, it is called interstitial impurity.

c) a Frenkel pair: in the case where a vacancy is located close to a self-interstitial;

d) an antisite: in the case where an atom of one sublattice is placed in the other sublattice; and e) an impurity: a foreign atom.

In addition, associations of the above defects are often possible, i.e., di-vacancy or vacancy-impurity complexes.

In the case where the periodicity of the monocrystal is perturbed by impurity atoms or crystal defects, discrete energy levels are introduced in the band gap. These levels are divided into shallow and deep levels.

The shallow level centers are usually donor or acceptor impurities. On the other hand, in contrast to shallow levels, deep level defects interact with both the conduction band and valence band and can be very efficient as centers of carrier trapping and recombination. In such a case, these defects are called electrically active and often referred to as "traps". They can influence carrier lifetime significantly even at very low concentrations.

Although SiC layers of excellent quality are available at present, they still contain native intrinsic defects which act as carrier traps and degrade materials characteristics. In particular, an intrinsic defect concentration is increased as a growth rate and a growth temperature are increased. The high thermal stability of SiC makes it usually difficult or impossible to remove these defects by a thermal treatment (anneal out). Since the increased growth rate is necessary for growing thick layers which are cost-effective, it is important to find a way to achieve low defect density in these layers.

It has been shown that defect concentration can be reduced, and the quality of a material in the state that crystal growth is completed (hereafter referred to as as-grown material) can be improved to a certain level by a high temperature thermal treatment (annealing). However, in the case of an SiC monocrystal, the improvement is not sufficient due to the above described high thermal stability. In addition, a part of intrinsic defects created by irradiation of electrons, protons, or ions can be removed by annealing, but another part is just reduced, and the lowest defect concentration is usually determined by the original as-grown material.

The electrically active defects in an as-grown SiC layer have been investigated by Zhang and others (Non Patent Document 1). In this document, the major electron traps and hole traps in an as-grown SiC layer were determined by using the Deep Level Transient Spectroscopy (DLTS) and the Minority Carrier Transient Spectroscopy (MCTS). More specifically, the traps in relation to the Ti and B impurities, and the Z1/Z2 and EH6/7 intrinsic defects in relation to electron traps were measured by these methods. In addition, the Z1/Z2 and EH6/7 traps showed the inverse correlation with the minority carrier lifetime.

Klein and others concluded that the Z1/Z2 defects have a large capture cross section for holes and dominate in limiting the minority carrier lifetime in the n-type SiC layer (Non Patent Document 2).

Kimoto and others investigated the concentration dependency of the Z1/Z2 center as the function of the ratio of carbon to silicon during the chemical vapor deposition (CVD) growth. They showed that the growth under C-rich conditions is a key factor to obtain the lower concentration of the Z1/Z2 center (Non Patent Document 3).

Storasta and others investigated the deep level in relation to the selective displacement of carbon atoms (Non Patent Document 4). The irradiation with electrons of energy below the threshold for silicon atom displacement was enough to create the Z1/Z2 and EH6/7 intrinsic defects. Consequently, they concluded that they must have relation to defects (complexes) related to either of carbon vacancies and interstitials.

Negoro and others investigated the reduction effect by annealing of the Z1/Z2 and EH6/7 traps in the as-grown material (Non Patent Document 5). By annealing at a temperature of 1700° C. or higher, a concentration of the Z1/Z2 and EH6/7 centers was decreased by one order of magnitude as compared to that in the as-grown epitaxial layer, but did not vanish completely.

It is known that, aluminum, boron, and nitrogen, etc. are ion-implanted into the surface layer, and a high temperature thermal treatment is carried out in order to make the implanted atoms electrically active in the surface layer and to utilize the surface layer as a device structure in the formation process of an SiC device. In addition, it is proposed that in the case where impurities such as boron are ion-implanted into the surface layer and the device structure is formed in the surface layer by making the impurities electrically active due to annealing, carbon is also ion-implanted simultaneously. Patent Document 1 relates to the technique for forming a p-type layer of boron that is utilized as a device structure. In the disclosed technique thereof, in order to selectively incorporate activated boron atoms into the silicon site having a shallow energy level, boron and carbon atoms are ion-implanted simultaneously into the surface layer, and electrically activated boron atoms are selectively introduced not into the carbon vacancies but into the silicon vacancies due to the existence of excess carbon interstitials in the surface layer in the case where boron atoms compete with silicon interstitials and carbon interstitials in the surface layer during annealing.

However, the object of such a technique already known is to make the impurities that have been implanted into the surface layer for forming the device structure, to be electrically active in the surface layer by annealing. Unlike the present invention described below, the above described technique does not indicate that carbon interstitials are introduced into the shallow surface layer of the as-grown SiC crystal, the carbon interstitials are diffused into a region deeper than the surface layer by the subsequent annealing, and the point defects vanish in the deep portion of the wafer.

Patent Document 1: U.S. Pat. No. 6,703,294
Non Patent Document 1: Journal of Applied Physics, Vol. 93, No. 8, pp. 4708-4714, 15 Apr. 2003
Non Patent Document 2: Applied Physics Letters, 88, 052110, 30 Jan. 2006
Non Patent Document 3: Applied Physics Letters, Vol. 79, No. 17, pp. 2761-2763, 22 Oct. 20001
Non Patent Document 4: Applies Physics Letters, Vol. 85, Issue 10, pp. 1716-1718, September 2004
Non Patent Document 5: Journal of Applied Physics, Vol. 96, No. 9, pp. 4909-4915, 1 Nov. 2004.

SUMMARY OF THE INVENTION

An object of the present invention is to provide a method of effectively reducing or eliminating the carrier trapping centers by high temperature annealing.

Moreover, another object of the present invention is to provide an SiC semiconductor device with less carrier trapping centers.

We propose that the reduction effect of defects in the as-grown material by annealing can be improved by incorporating excess carbon interstitials. The major defects in SiC are extremely stable, but they can be annealed out or made inactive by capturing a mobile carbon interstitial. Thereafter, carbon interstitials vanish together with carbon vacancies, or other defects that are not electrically active are formed. We also suggest that these excess carbon interstitials themselves do not form electrically active defects and do not create a state in the band gap.

More specifically, the object of the present invention is achieved by the method comprising the additional steps of:

(a) ion-implanting atoms such as carbon, silicon, hydrogen, and helium into the surface layer at the edge face of the SiC crystal layer to introduce carbon interstitials into the surface layer for forming a source of excess carbon interstitials with respect to defects present in the SiC crystal layer, and (b) diffusing carbon interstitials that have been introduced into the surface layer into the material underneath the implanted layer (into the bulk layer) and combining vacancies and carbon interstitials in the bulk layer by annealing.

This technique results in additional carbon interstitials available which diffuse into the material underneath the implanted layer during the annealing step (b). These excess carbon interstitials fill the vacancies during the annealing step (b), thus eliminating them or forming other defects which are not act as excellent recombination centers. In this way, it is possible to improve the carrier lifetime in the SiC layer which is important for bipolar devices.

According to our measurements after applying the preferred embodiment of the invention, a signal from the Z1/Z2 and EH6/7 has vanished completely, thus the traps have become electrically inactive. This is also reflected in the measurement of the minority carrier lifetime.

It is most preferable to use carbon that can introduce carbon interstitials directly and that acts neutrally to the SiC crystal as an atom to be implanted into the surface layer in order to introduce excess carbon interstitials and to fill the vacancies in SiC crystal layer. However, even in the case where any ions other than carbon are implanted, if the implantation energy and implantation amount are sufficient, carbon atoms that constitute an SiC crystal can be knocked out from the site by implanted atoms, and as a result (indirectly), carbon interstitials can be created in the surface layer of the SiC crystal.

In particular, since silicon atoms, hydrogen atoms, and helium atoms are neutral in the SiC crystal similarly to carbon atoms, p-type or n-type doping into the surface layer can be prevented from being carried out by a high temperature annealing after carbon interstitials are introduced. Consequently, those atoms are more suitable than other atoms.

In the case where atoms other than carbon atoms, silicon atoms, hydrogen atoms, and helium atoms are implanted, those implanted atoms act as an impurity (dopant) of a p-type or an n-type, and the surface layer shows a p-type or an n-type of a high concentration or a high resistance after annealing. Meanwhile, in a region deeper than the surface layer, carbon interstitials are diffused out from the surface layer by a high temperature annealing, thereby enabling reduction of vacancies.

Alternatively, in the case where an electron beam with energy of 90 KeV or higher is irradiated, the carbon interstitials can also be introduced into the surface layer. This is because, in the case where an electron beam is irradiated to the SiC crystal and energy of the electron beam is approximately 90 KeV or higher, carbon atoms that constitute an SiC crystal are knocked out from the original site and carbon interstitials are created.

Moreover, it is also possible to introduce the carbon interstitials into the surface layer by oxidation of the surface layer in the SiC crystal in an oxygen atmosphere at 800° C. or higher. This is because, in the case where the surface layer of the SiC crystal is oxidized, excess carbon interstitials are created mainly around an interface of the oxidized layer and the SiC crystal. In such a case, the surface layer in the SiC crystal cannot be oxidized with a sufficient speed at a temperature less than 800° C. The most suitable oxidation temperature is in the range from 1050° C. to 1250° C.

More specifically, according to the present invention, there is provided a method for improving the quality of an SiC crystal by eliminating or extremely reducing carrier trapping centers in an as-grown SiC crystal layer comprising the steps of:

(a) carrying out ion implantation of certain atoms into a shallow surface layer of the SiC crystal layer to additionally introduce carbon interstitials into the surface layer, and (b) heating the SiC crystal for making the carbon interstitials that have been additionally introduced into the surface layer to diffuse out from the surface layer into a deep portion (bulk layer) and for combining the carbon interstitials and point defects, to thereby make the electrically active point defects in the bulk layer inactive.

An embodiment of the present invention further comprises the step (c) of etching or mechanically removing the surface layer into which atoms have been implanted.

In another embodiment of the present invention, the step (a) is carried out in the condition that n-type or p-type doping into the surface layer is not carried out by ion-implanting atoms selected from carbon atoms, silicon atoms, hydrogen atoms, or helium atoms in particular.

In another embodiment of the present invention, the steps (a) and (b) are carried out simultaneously.

In another embodiment of the present invention, the step (a) is carried out by irradiating an electron beam having energy of 90 KeV or higher.

In another embodiment of the present invention, the step (a) is carried out by oxidizing the surface layer in an oxygen atmosphere at 800° C. or higher.

In another embodiment of the present invention, the step (a) further comprises selecting the dose of atoms to be implanted in such a manner that a concentration of the created carbon interstitials exceeds that of the electrically active point defects in the bulk layer.

It is preferable that the ion implantation energy of atoms is in the range from 10 KeV to 10 MeV in the step (a).

In the step (a), a temperature of the SiC substrate during ion implantation is preferably in the range from 10° C. to 1700° C., and more preferably in the range from 20° C. to 1000° C.

In the step (b), an annealing temperature is preferably in the range from 1200 to 2200° C., and more preferably in the range from 1400° C. to 1900° C.

In an embodiment of the present invention, an SiC wafer provided with an epitaxial layer is used in the steps (a) and (b).

In another embodiment of the present invention, an SiC bulk crystal is used in the steps (a) and (b).

In another embodiment of the present invention, a wafer sliced from an SiC bulk crystal is used in the steps (a) and (b).

In another embodiment of the present invention, an SiC monocrystal wafer is used in the steps (a) and (b) that has been formed as an epitaxial layer by a process in which after an SiC epitaxial layer is obtained using a wafer sliced from an SiC bulk crystal as a substrate, the substrate portion is removed.

In another embodiment of the present invention, an SiC wafer having a combination of any of n-type and p-type epitaxial layers is used in the steps (a) and (b).

Moreover, according to the present invention, there is provided a method for improving the quality of an SiC crystal by eliminating or reducing carrier trapping centers in an as-grown SiC crystal layer comprising the steps of:

(a) carrying out the ion implantation of carbon atoms, silicon atoms, hydrogen atoms, or helium atoms into a shallow surface layer of the SiC crystal layer to additionally introduce carbon interstitials into the surface layer, and (b) growing the SiC layer upward from the edge face of the surface layer into which the carbon interstitials have been introduced, diffusing out the carbon interstitials that have been introduced into the surface layer from the surface layer into the grown layer, and combining the carbon interstitials and point defects to make the electrically active point defects in the grown layer inactive.

In an embodiment of the present invention, the step (a) further comprises selecting the dose of atoms to be implanted in such a manner that a concentration of the additionally introduced carbon interstitials exceeds that of the electrically active point defects in the grown layer.

It is preferable that the ion implantation energy of atoms is in the range from 10 KeV to 10 MeV in the step (a).

In the step (a), a temperature of the SiC substrate during ion implantation is preferably in the range from 10° C. to 1700° C., and more preferably in the range from 20° C. to 1000° C.

In an embodiment of the present invention, an SiC wafer provided with an epitaxial layer is used in the steps (a) and (b).

In an embodiment of the present invention, an SiC wafer provided with an epitaxial layer is used in the steps (a) and (b).

In another embodiment of the present invention, a wafer sliced from an SiC bulk crystal is used in the steps (a) and (b).

In another embodiment of the present invention, an SiC monocrystal wafer is used in the steps (a) and (b) that has been formed as an epitaxial layer by a process in which after an SiC epitaxial layer is obtained using a wafer sliced from an SiC bulk crystal as a substrate, the substrate portion is removed.

In another embodiment of the present invention, an SiC wafer having a combination of any of n-type and p-type epitaxial layers is used in the steps (a) and (b).

In the present invention, a width of the shallow surface layer into which the carbon interstitials are introduced by ion implantation or the like in the step (a) is, for instance, in the range from 100 nm to 2000 nm from the surface. A width of the region including carbon atoms that have been diffused out by annealing in the step (b) and that have made the electrically active point defects inactive is, for instance, in the range from 10000 nm to 300000 nm from the surface (edge face of the wafer) (10 μm to 300 μm from the surface).

In the step (a) of the invention, other than carbon interstitials, carbon vacancies, silicon vacancies, and silicon interstitials are simultaneously created by carrying out ion implantation into the surface layer. A part of these carbon vacancies, silicon vacancies, and silicon interstitials are diffused into the bulk layer from the surface layer as well as the carbon interstitials in the step (b).

In the bulk layer, other than carbon vacancies and complex defects thereof, point defects constituted by carbon interstitials and complex defects thereof, silicon interstitials and complex defects thereof, or silicon vacancies and complex defects thereof are present, while the carbon vacancies diffused from the surface layer combine with carbon interstitials and complex defects thereof, the silicon vacancies diffused from the surface layer combine with silicon interstitials and complex defects thereof, the silicon interstitials diffused from the surface layer combine with silicon vacancies and complex defects thereof, and thereby the point defects in the bulk layer are reduced.

In one case, a carrier lifetime in the bulk layer may be controlled due to a point defect density of the carbon vacancies and complex defects thereof, while in another case, the carrier lifetime in the bulk layer may be controlled due to a point defect density of carbon interstitials and complex defects thereof, silicon interstitials and complex defects thereof, or silicon vacancies and complex defects thereof.

In the former case, quality of the bulk layer can be improved by introducing excess carbon interstitials in the step (a), and combining the carbon interstitials diffused from the surface layer with the carbon vacancies in the bulk layer in the following step (b). Meanwhile, in the latter case, the effect becomes to dominate by introducing excess carbon vacancies, silicon vacancies, and silicon interstitials in the step (a), and combining the carbon vacancies diffused from the surface layer with the carbon interstitials and complex defects thereof in the bulk layer, the silicon vacancies diffused from the surface layer with the silicon interstitials and complex defects thereof in the bulk layer, and the silicon interstitials diffused from the surface layer with the silicon vacancies and complex defects thereof in the bulk layer in the following step (b). A degree of the effect is thought to be dependent on the crystal quality of the original bulk layer.

Moreover, a large stress will be induced in the SiC monocrystal by carrying out ion implantation into the surface layer in the step (a). In this case, point defects that have been present in the bulk layer such as carbon interstitials, carbon vacancies, silicon interstitials, and silicon vacancies will migrate into the surface layer to relax the stress by carrying the thermal treatment in the step (b), thus the densities of the carbon interstitials and complex defects thereof, the carbon vacancies and complex defects thereof, the silicon interstitials and complex defects thereof, and the silicon vacancies and complex defects thereof that have been present in the bulk layer are reduced.

More specifically, according to the present invention, there is provided a method for improving the quality of an SiC crystal by eliminating or reducing carrier trapping centers in as-grown SiC crystal layer comprising the steps of:

(a) carrying out ion implantation into a shallow surface layer of the SiC crystal layer to introduce interstitials and vacancies or stress into the surface layer, and (b) heating the SiC crystal for making the interstitials and vacancies that have been introduced into the surface layer to diffuse out from the surface layer into a bulk layer and for combining the interstitials or vacancies with point defects, or for migrating the point defects in the bulk layer towards the surface layer by utilizing the stress that have been induced into the surface layer, to thereby make the electrically active point defects in the bulk layer inactive or vanish.

An embodiment of the present invention further comprises the step (c) of etching or mechanically removing the surface layer into which atoms have been implanted.

In another embodiment of the present invention, atoms to be ion-implanted are carbon atoms, silicon atoms, hydrogen atoms, or helium atoms that act neutrally to the SiC crystal in the step (a).

In another embodiment of the present invention, the steps (a) and (b) are carried out simultaneously.

It is preferable that the ion implantation energy of atoms is in the range from 10 KeV to 10 MeV in the step (a).

In step (a), a temperature of the SiC substrate during ion implantation is preferably in the range from 10° C. to 1700° C., and more preferably in the range from 20° C. to 1000° C.

In step (b), an annealing temperature is preferably in the range from 1200 to 2200° C., and more preferably in the range from 1400° C. to 1900° C.

Furthermore, according to the present invention, there is provided a method for improving the quality of an SiC crystal by eliminating or reducing carrier trapping centers in as-grown SiC crystal layer comprising the steps of:

(a) carrying out ion implantation of carbon atoms, silicon atoms, hydrogen atoms, or helium atoms into a shallow surface layer of the SiC crystal layer to introduce interstitials and vacancies or stress into the surface layer, and (b) growing the SiC layer upward from the edge face of the surface layer into which the interstitials and vacancies or stress have been introduced, and diffusing out the interstitials and vacancies that have been introduced into the surface layer from the surface layer into the grown layer and combining the interstitials or vacancies with point defects, or migrating the point defects in the bulk layer towards the surface layer by utilizing the stress that have been induced into the surface layer, to thereby make the electrically active point defects in the grown layer inactive or vanish.

It is preferable that the ion implantation energy of atoms is in the range from 10 KeV to 10 MeV in step (a).

In step (a), a temperature of the SiC substrate during ion implantation is preferably in the range from 10° C. to 1700° C., and more preferably in the range from 20° C. to 1000° C.

In the above inventions, SiC wafer, etc., described above such as an SiC wafer provided with an epitaxial layer, an SiC bulk crystal, a wafer sliced from an SiC bulk crystal, an SiC monocrystal wafer that has been formed as an epitaxial layer by a process in which after an SiC epitaxial layer is obtained using a wafer sliced from an SiC bulk crystal as a substrate, the substrate portion is removed, an SiC wafer having a combination of any of n-type and p-type epitaxial layers are preferably used in the steps (a) and (b).

According to the present invention, there is provided a semiconductor device of all types including a diode, a transistor, an insulated gate bipolar transistor (IGBT), a metal oxide semiconductor field effect transistor (MOSFET), and a thyristor (including a gate turn-off thyristor), produced using the above described method. In particular, according to the present invention, there is provided a bipolar type SiC semiconductor device as described below. In such a bipolar type SiC semiconductor device, a carbon implanted layer, a silicon implanted layer, a hydrogen implanted layer, or a helium implanted layer is formed selectively in a region in which a reduction of electrically active point defects is particularly effective in the device.

Such a carbon implanted layer, a silicon implanted layer, a hydrogen implanted layer, or a helium implanted layer is formed by applying the above method in the fabrication process of the device, and defined by the existence of carbon atoms, silicon atoms, hydrogen atoms, or helium atoms that have been introduced by carrying out ion implantation. In addition, a carbon implanted layer, a silicon implanted layer, a hydrogen implanted layer, or a helium implanted layer is formed in a region other than that around a p-n interface in which an injection of minority carriers is carried out (within 500 nm from the p-n interface) and that in a conductivity modulation layer.

Moreover, such a bipolar type SiC semiconductor device comprises a region in which electrically active point defects are reduced by diffusing out carbon interstitials, silicon interstitials, carbon vacancies or silicon vacancies that have been introduced by the ion implantation of carbon atoms, silicon atoms, hydrogen atoms, or helium atoms into the conductivity modulation layer by annealing, and by combining the carbon interstitials, the silicon interstitials, the carbon vacancies or the silicon vacancies with point defects in the conductivity modulation layer, or a region in which electrically active point defects are reduced by migrating the point defects in the conductivity modulation layer towards the carbon implanted layer, the silicon implanted layer, the hydrogen implanted layer, or the helium implanted layer with annealing by utilizing a stress that have been induced by the ion implantation of carbon atoms, silicon atoms, hydrogen atoms, or helium atoms.

In a preferred embodiment, the bipolar type SiC semiconductor device comprises a region in which point defects are reduced by diffusing out the carbon interstitials that have been introduced by the ion implantation of carbon atoms, silicon atoms, hydrogen atoms, or helium atoms by annealing, and by combining the carbon interstitials and point defects in the conductivity modulation layer (hereafter referred to as carbon diffused region).

In particular, in a bipolar type semiconductor device of high withstand voltage, in order to restrict an amount of minority carriers to be injected to the conductivity modulation layer (base layer), electron beams or hydrogen ions (protons) are irradiated to a region around a p-n junction interface from which an injection of minority carriers is carried out to the base layer and a region in the conductivity modulation layer in some cases to intentionally increase a concentration of point defects around a p-n junction interface and in the conductivity modulation layer. In such a case, in the p-n junction, a region within approximately 500 nm from the p-n junction interface influences a degree of an injection amount of minority carriers.

However, since an object of the present invention is to reduce or eliminate point defects around the p-n junction interface and in the conductivity modulation layer, a carbon implanted layer, a silicon implanted layer, a hydrogen implanted layer, or a helium implanted layer is formed in a region other than that around the p-n junction interface and that in the conductivity modulation layer. Consequently, a location in which a carbon implanted layer, a silicon implanted layer, a hydrogen implanted layer, or a helium implanted layer is formed in a bipolar type semiconductor device according to the present invention is clearly different from a location in which electron beams or hydrogen atoms are irradiated or implanted in a conventional bipolar type semiconductor device.

As an application example of the present invention, there can be thought an embodiment in which a carbon implanted layer, a silicon implanted layer, a hydrogen implanted layer, or a helium implanted layer is formed in a region other than that around the p-n junction interface and that in the conductivity modulation layer based on the present invention, a region in which electrically active point defects are reduced is formed in the conductivity modulation layer by diffusing out the carbon interstitials that have been introduced by the ion implantation of carbon atoms, silicon atoms, hydrogen atoms, or helium atoms by annealing, and combining the carbon interstitials and point defects, and thereafter electron beams or hydrogen atoms are irradiated to a region around the p-n junction interface or a region in the conductivity modulation layer to precisely control an amount of minority carriers to be injected.

As an example, carbon that exists in the carbon diffused region and that has been made by diffusing out carbon interstitials by annealing has a profile of exponentially reducing in a direction diffusing out by annealing from the surface layer into which the carbon atoms, silicon atoms, hydrogen atoms, or helium atoms have been ion-implanted in the region. In the case where an ion implantation is carried out to the SiC substrate and an epitaxial layer is then grown on the SiC substrate to fabricate a device, carbon that exists in the above described carbon diffused region and that has been made by diffusing out carbon interstitials by annealing has a profile of exponentially reducing in a direction from an interface of the substrate and the epitaxial layer to the surface of the epitaxial layer.

One of ordinary skill in the art will properly select the dose applied for forming a carbon implanted layer, a silicon implanted layer, a hydrogen implanted layer, or a helium implanted layer to eliminate or reduce to an effective degree the electrically active point defects in a device.

More specifically, a bipolar type SiC semiconductor device according to the present invention comprises:

an SiC substrate of an n-type or a p-type, and at least one SiC epitaxial layer of an n-type or a p-type or at least one ion implanted layer of an n-type or a p-type;

a carbon implanted layer, a silicon implanted layer, a hydrogen implanted layer, or a helium implanted layer in at least one of regions around the surface of the SiC substrate, around an interface of the SiC substrate and the SiC epitaxial layer, and around the surface of the SiC epitaxial layer, except for a region around a p-n junction interface and a region in a conductivity modulation layer (base layer); and a region in which electrically active point defects are reduced by diffusing out the carbon interstitials that have been introduced by the ion implantation of carbon atoms, silicon atoms, hydrogen atoms, or helium atoms into the conductivity modulation layer by annealing, and by combining the carbon interstitials and point defects in the conductivity modulation layer. Preferable embodiments of such a bipolar type SiC semiconductor device are mentioned in the following.

(i) An SiC pn diode comprising a high-doped p-type layer, a low-doped n-type base layer, and a high-doped n-type layer;
further comprising:
a carbon implanted layer, a silicon implanted layer, a hydrogen implanted layer, or a helium implanted layer in at least one of a region around the surface of the high-doped p-type layer and a region in the high-doped n-type layer, except for a region around a p-n junction interface and a region in the low-doped n-type base layer; and
a region in which electrically active point defects are reduced by diffusing out the carbon interstitials that have been introduced by the ion implantation of carbon atoms, silicon atoms, hydrogen atoms, or helium atoms into the low-doped n-type base layer by annealing, and by combining the carbon interstitials and point defects in the low-doped n-type base layer.

(ii) An SiC pn diode comprising a high-doped n-type layer, a low-doped p-type base layer, and a high-doped p-type layer;
further comprising:
a carbon implanted layer, a silicon implanted layer, a hydrogen implanted layer, or a helium implanted layer in at least one of a region around the surface of the high-doped n-type layer and a region in the high-doped p-type layer, except for a region around a p-n junction interface and a region in the low-doped p-type base layer; and
a region in which electrically active point defects are reduced by diffusing out the carbon interstitials that have been introduced by the ion implantation of carbon atoms, silicon atoms, hydrogen atoms, or helium atoms into the low-doped p-type base layer by annealing, and by combining the carbon interstitials and point defects in the low-doped p-type base layer.

(iii) An SiC npn transistor type device comprising an n-type emitter layer, a p-type base layer, and an n-type collector layer;
further comprising:
a carbon implanted layer, a silicon implanted layer, a hydrogen implanted layer, or a helium implanted layer in at least one of a region around the surface of the n-type emitter layer and a region in the n-type collector layer, accept for a region around a p-n junction interface and a region in the p-type base layer; and
a region in which electrically active point defects are reduced by diffusing out the carbon interstitials that have been introduced by the ion implantation of carbon atoms, silicon atoms, hydrogen atoms, or helium atoms into the p-type base layer by annealing, and by combining the carbon interstitials and point defects in the p-type base layer.

(iv) An SiC pnp transistor type device comprising a p-type emitter layer, an n-type base layer, and a p-type collector layer;
further comprising:
a carbon implanted layer, a silicon implanted layer, a hydrogen implanted layer, or a helium implanted layer in at least one of a region around the surface of the p-type layer and a region in the p-type collector layer, except for a region around a p-n junction interface, a region in the n-type base layer, and
a region in which electrically active point defects are reduced by diffusing out the carbon interstitials that have been introduced by the ion implantation of carbon atoms, silicon atoms, hydrogen atoms, or helium atoms into the n-type base layer by annealing, and by combining the carbon interstitials and point defects in the n-type base layer.

(v) An SiC thyristor type device (including a gate turn-off type thyristor device) comprising a p-type layer, an n-type base layer, a p-type base layer, and an n-type layer;

further comprising:

a carbon implanted layer, a silicon implanted layer, a hydrogen implanted layer, or a helium implanted layer in at least one of a region around the surface of the p-type layer and a region in the n-type layer, except for a region around a p-n junction interface, a region in the n-type base layer, and a region in the p-type base layer; and a region in which electrically active point defects are reduced by diffusing out the carbon interstitials that have been introduced by the ion implantation of carbon atoms, silicon atoms, hydrogen atoms, or helium atoms into the n-type base layer and the p-type base layer by annealing, and by combining the carbon interstitials and point defects in the n-type base layer and the p-type base layer.

(vi) An SiC thyristor type device (including a gate turn-off type thyristor device) comprising an n-type layer, a p-type base layer, an n-type base layer, and a p-type layer;

further comprising:

a carbon implanted layer, a silicon implanted layer, a hydrogen implanted layer, or a helium implanted layer in at least one of a region around the surface of the n-type layer and a region in the p-type layer, except for a region abound a p-n junction interface, a region in the p-type base layer, and a region in the n-type base layer; and a region in which electrically active point defects are reduced by diffusing out the carbon interstitials that have been introduced by the ion implantation of carbon atoms, silicon atoms, hydrogen atoms, or helium atoms into the p-type base layer and the n-type base layer by annealing, and by combining the carbon interstitials and point defects in the p-type base layer and the n-type base layer.

(vii) An SiC IGBT type device comprising a p-type layer, an n-type base layer, a p-type base layer, and an n-type collector layer;

further comprising:

a carbon implanted layer, a silicon implanted layer, a hydrogen implanted layer, or a helium implanted layer in at least one of a region in the n-type collector layer except for a region around an interface of the p-type base layer and the n-type collector layer, and a region around the surface of the p-type base layer on the n-type base layer side; and a region in which electrically active point defects are reduced by diffusing out the carbon interstitials that have been introduced by the ion implantation of carbon atoms, silicon atoms, hydrogen atoms, or helium atoms into the p-type base layer by annealing, and by combining the carbon interstitials and point defects in the p-type base layer.

(viii) An SiC IGBT type device comprising an n-type layer, a p-type base layer, an n-type base layer, and a p-type collector layer;

further comprising:

a carbon implanted layer, a silicon implanted layer, a hydrogen implanted layer, or a helium implanted layer in at least one of a region in the p-type collector layer except for a region around an interface of the n-type base layer and the p-type collector layer, and a region around the surface of the n-type base layer on the p-type base layer side; and a region in which electrically active point defects are reduced by diffusing out the carbon interstitials that have been introduced by the ion implantation of carbon atoms, silicon atoms, hydrogen atoms, or helium atoms into the n-type base layer by annealing, and by combining the carbon interstitials and point defects in the n-type base layer.

Further, an SiC bipolar type semiconductor device according to another embodiment of the present invention comprises:

an SiC substrate of an n-type or a p-type, and at least one SiC epitaxial layer of an n-type or a p-type or at least one ion implanted layer of an n-type or a p-type;

a carbon implanted layer, a silicon implanted layer, a hydrogen implanted layer, or a helium implanted layer in at least one of regions around the surface of the SiC substrate, around an interface of the SiC substrate and the SiC epitaxial layer, and around the surface of the SiC epitaxial layer, except for a region around a p-n junction interface and a region in a conductivity modulation layer (base layer); and a region in which electrically active point defects are reduced by diffusing out interstitials and vacancies that have been introduced by the ion implantation of carbon atoms, silicon atoms, hydrogen atoms, or helium atoms into the conductivity modulation layer by annealing, and by combining the interstitials or vacancies with point defects in the conductivity modulation layer, or a region in which electrically active point defects are reduced by migrating the point defects in the conductivity modulation layer towards the carbon implanted layer, the silicon implanted layer, the hydrogen implanted layer, or the helium implanted layer with annealing by utilizing a stress that have been induced by the ion implantation of carbon atoms, silicon atoms, hydrogen atoms, or helium atoms.

The further advantages and preferred features of the present invention will appear from the following descriptions and the accompanying drawings.

According to the present invention, the carrier trapping centers can be effectively reduced or eliminated by high temperature annealing.

Moreover, an SiC semiconductor device according to the present invention has excellent device characteristics since a concentration of carrier trapping centers is eliminated or reduced in an introduced region and a diffused region of carbon interstitials.

EXPLANATIONS OF LETTERS OR NUMERALS

Figure 1:
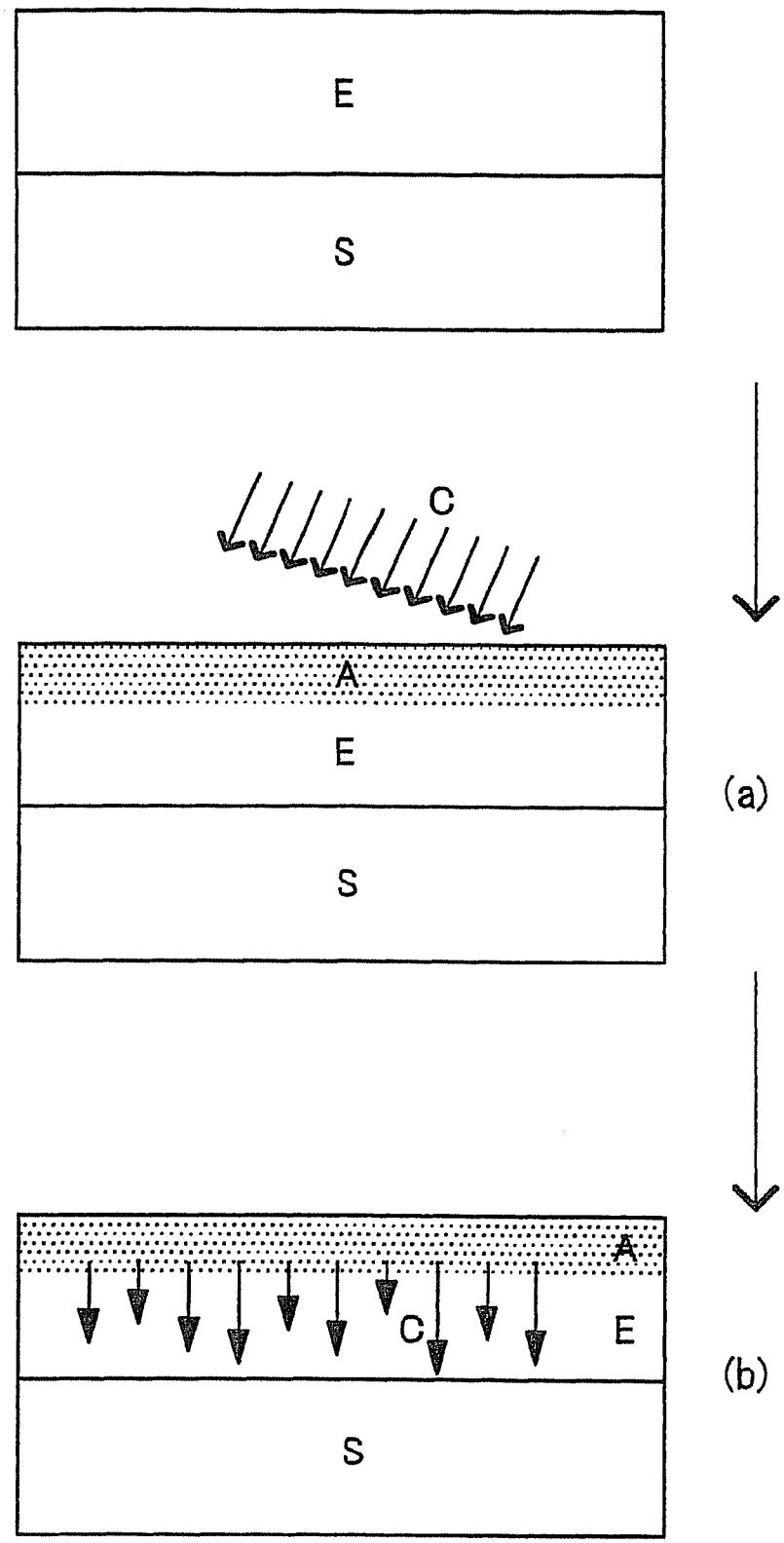
FIG. 1 is a schematic view showing the process of fabricating an SiC layer in which recombination centers are reduced while utilizing the method according to a preferred embodiment of the present invention.

10 SiC pn diode
11 high-doped n-type SiC layer
12 low-doped n-type SiC base layer
13 high-doped p-type SiC layer
14 p-type ion implanted layer for field relaxation
15 anode
16 cathode
20 SiC pn diode
21 high-doped p-type SiC layer
22 low-doped p-type SiC base layer
23 high-doped n-type SiC layer
24 n-type ion implanted layer for field relaxation
25 cathode
26 anode
30 SiC npn transistor
31 p-type SiC base layer
32 n-type SiC collector layer
33 n-type SiC emitter layer
34 high-doped p-type ion implanted layer
35 gate electrode
36 emitter electrode
37 collector electrode
40 SiC pnp transistor
41 n-type SiC base layer
42 p-type SiC collector layer
43 p-type SiC emitter layer
44 high-doped n-type ion implanted layer
45 gate electrode
46 emitter electrode
47 collector electrode
50 SiC thyristor
51 n-type SiC layer
52 p-type SiC base layer
53 n-type SiC base layer
54 p-type SiC layer
55 high-doped n-type ion implanted layer
56 gate electrode
57 anode
58 cathode
60 SiC thyristor
61 p-type SiC layer
62 n-type SiC base layer
63 p-type SiC base layer
64 n-type SiC layer
65 high-doped p-type ion implanted layer
66 gate electrode
67 cathode
68 anode
70 SiC IGBT
71 p-type SiC base layer
72 n-type SiC collector layer
73 p-type layer
74 n-type base layer
75 gate electrode
76 emitter electrode
77 collector electrode
78 oxide film
80 SiC IGBT
81 n-type SiC base layer
82 p-type SiC collector layer
83 n-type layer
84 p-type base layer
85 gate electrode
86 emitter electrode
87 collector electrode
88 oxide film
100 carbon implanted layer
200 carbon diffused region
A surface layer
B SiC bulk crystal
C carbon atom
E, E1, E2 epitaxial layer
S substrate

DETAILED DESCRIPTION OF THE INVENTION

A preferred embodiment of the present invention will be described below in detail with reference to the accompanying drawings. FIG. 1 is a schematic view showing the process of fabricating an SiC layer in which recombination centers are reduced while utilizing the method according to a preferred embodiment of the present invention.

In the SiC crystal layer according to the present embodiment, an epitaxial layer (E) is grown from the surface of an SiC substrate (S). A known method, preferably chemical vapor deposition (CVD), is applied to the growth of the epitaxial layer (E).

As the step (a), carbon atoms (C) are ion-implanted into a shallow surface layer (A) of the epitaxial layer (E). By the above step, excess carbon interstitials are introduced into the surface layer (A).

Next, as the step (b), by heating the SiC crystal layer, carbon interstitials introduced into the surface layer (A) are diffused out from the surface layer (A) to the epitaxial layer (E) that is a bulk layer under the surface layer (A). At this time, during the step (b), carbon interstitials vanish together with carbon vacancies in the epitaxial layer (E), or other defects that are not electrically active are formed. As a result, the electrically active point defects that exist in the epitaxial layer (E) are annealed out or made inactive.

The step (a) for implanting carbon atoms (C) and the step (b) for annealing the SiC crystal layer can be carried out simultaneously.

Moreover, the surface layer (A) into which carbon atoms (C) have been implanted can be etched or mechanically removed.

By the above steps, the quality of the epitaxial layer (E) can be improved.

Figure 2:
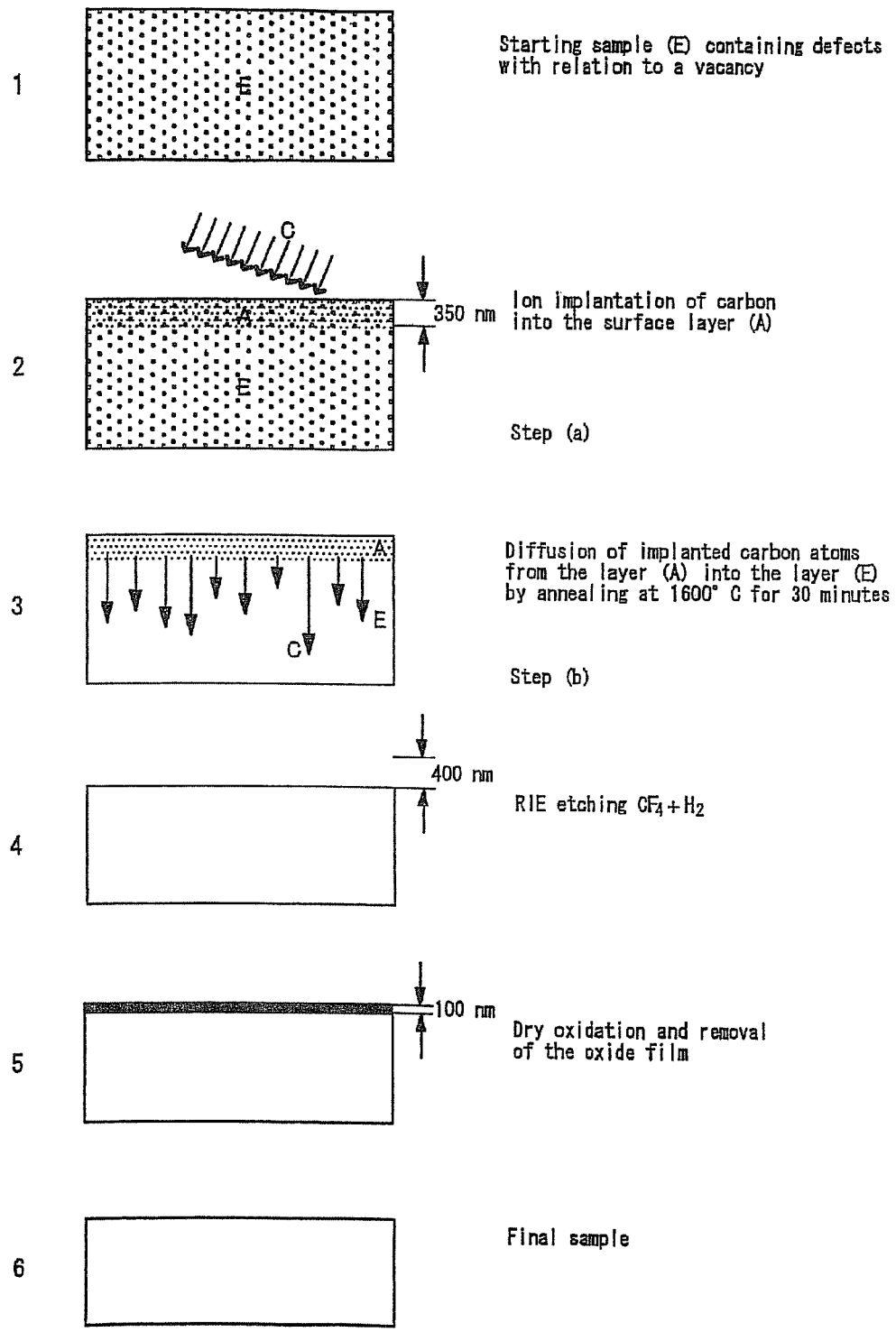
FIG. 2 is a schematic view showing the process of fabricating an SiC layer in which recombination centers are reduced while utilizing the method according to a preferred embodiment of the present invention.

While referring to FIG. 2, the following describes a detailed example in the case where the above steps are applied to a substrate provided with an n-type SiC epitaxial layer in the order of steps.

First, an n-type epitaxial layer (E) with a thickness of 50 μm is grown on an SiC crystal substrate by a known method, preferably by CVD. This as-grown epitaxial layer (E) includes vacancies as shown by void circles in the figure. Here, in general, a thickness of the epitaxial layer is determined by the withstand voltage of a device to be obtained.

(2) After that, carbon atoms (C) are ionized and accelerated towards the surface of the epitaxial layer (E) heated to 600° C. while using acceleration energy in the range from 10 KeV to 150 KeV and a dose in the range from 0.25 E12 cm$^{-2}$ to 1.45 E12 cm$^{-2}$. Here, crystal defects that are created in the surface layer portion by ion implantation can be reduced by heating the epitaxial layer during ion implantation.

In this way, carbon atoms (C) are implanted into the epitaxial layer (E) to form the surface layer (a) that is a carbon interstitial rich layer with a thickness of 250 nm. The concentration of the implanted carbon in the region is almost constant around 1.5 E17 cm$^{-3}$.

(3) After that, the epitaxial layer (E) is heated at 1600° C. for 30 minutes for annealing to make the carbon implanted therein to diffuse out of the surface layer (A). During the annealing, the carbon atoms (interstitials) are attached to and combined with point defects in the epitaxial layer (E) under the surface layer (A) to make the point defects electrically inactive. Since more carbon has been implanted into the surface layer (A) than there are electrically active defects in the epilayer (E), all the defects can be made inactive. In this way, the epitaxial layer (E) under the surface layer (A) will have the reduced concentration of the electrically active point defects.

(4) The surface layer (A) at the upper edge into which carbon atoms (C) have been implanted contains defects in relation to an implantation damage. Therefore, the surface layer (A) is removed by reactive ion etching (RIE) using CH$_4$ and O$_2$ gases in order to demonstrate the influence of the innovation of the implanted carbon atoms (C) to the epitaxial layer (E) under the surface layer (A). A thickness to be removed by RIE is in the range of 400 nm from the surface. However, the surface layer (A) can be left or removed by other known techniques depending on the application.

(5) After that, if necessary, in order to smooth the surface, the surface of the epitaxial layer (E) can be oxidized using high temperature oxygen to form an SiO$_2$ oxide film with a thickness of approximately 100 nm, and the oxide film can be removed.

(6) Through the above steps, a quality improved SiC sample can be obtained.

Figure 3:
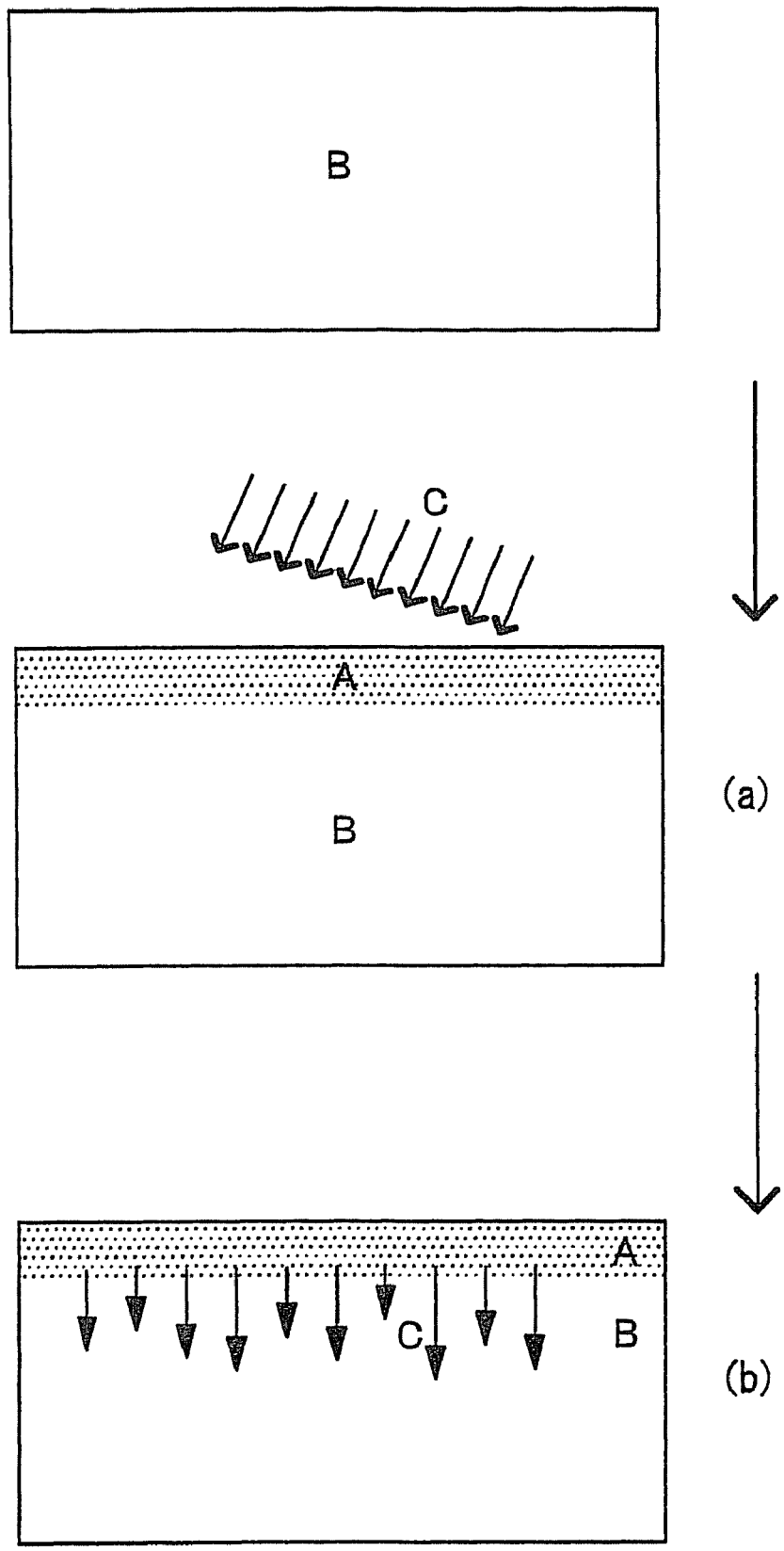
FIG. 3 is a schematic view showing the process of fabricating an SiC layer in which recombination centers are reduced while utilizing the method according to another preferred embodiment of the present invention.

FIG. 3 is a schematic view showing the process of fabricating an SiC layer in which recombination centers are reduced while utilizing the method according to another preferred embodiment of the present invention. In the present embodiment, an SiC bulk crystal (B) is used as an SiC crystal. The SiC bulk crystal (B) can also be a wafer sliced from an as-grown SiC bulk crystal.

Such an SiC bulk crystal (B) is a bulk-like crystal that has been obtained by the sublimation method, the HTCVD method, or the like. An SiC wafer can be obtained by slicing such a bulk crystal, for instance, at a thickness in the range from 300 to 400 μm. The electrically active point defects formed during the growth of a crystal or the like are contained therein.

As the step (a), the carbon atoms (C) are ion-implanted into the shallow surface layer (A) on the upper face side of the SiC bulk crystal (B). By the above step, excess carbon interstitials are introduced into the surface layer (A).

Next, as the step (b), by heating the SiC bulk crystal (B), the carbon atoms (C) implanted into the surface layer (A) are diffused out from the surface layer (A) into the SiC bulk crystal (B) under the surface layer (A). During the annealing, carbon interstitials vanish together with carbon vacancies in the SiC bulk crystal (B), or other defects that are not electrically active are formed. As a result, the electrically active point defects that exist in the SiC bulk crystal (B) are annealed out or made inactive.

The step (a) for implanting carbon atoms (C) and the step (b) for annealing the SiC bulk crystal (B) can be carried out simultaneously.

Moreover, the surface layer (A) into which carbon atoms (C) have been implanted can be etched or mechanically removed.

By the above steps, the quality of the SiC bulk crystal (B) can be improved.

Figure 4:
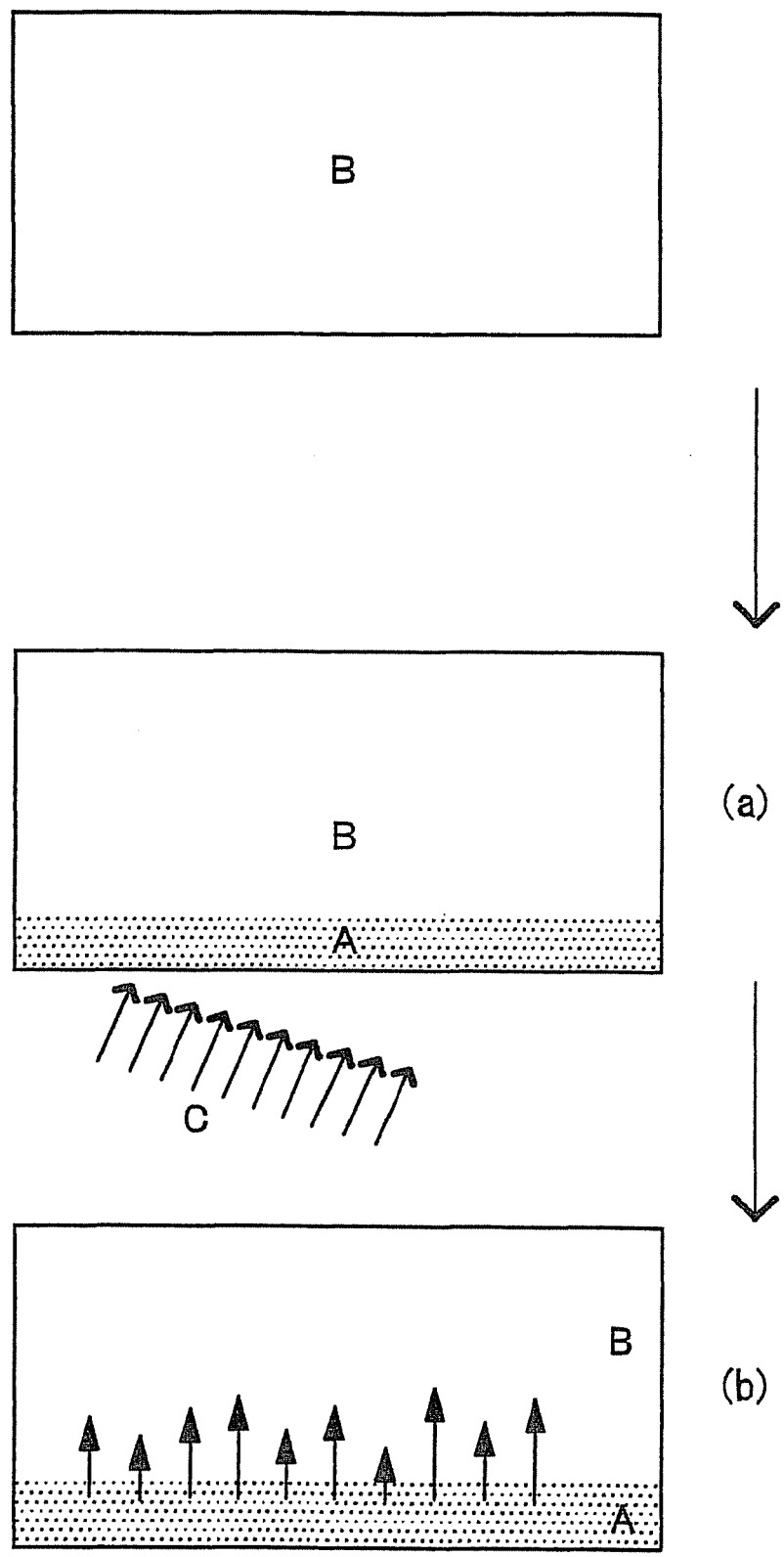
FIG. 4 is a schematic view showing the process of fabricating an SiC layer in which recombination centers are reduced while utilizing the method according to another preferred embodiment of the present invention.

FIG. 4 is a schematic view showing the process of fabricating an SiC layer in which recombination centers are reduced while utilizing the method according to another preferred embodiment of the present invention. In the present embodiment, similarly to FIG. 3, an SiC bulk crystal (B) is used as an SiC crystal. However, this case includes a case in which an optional epitaxial layer exists on the SiC bulk crystal shown in FIG. 4. In the embodiment shown in FIG. 3, carbon atoms (C) are ion-implanted into the surface layer (A) on the upper face side of the SiC bulk crystal (B), and carbon interstitials are diffused out into the SiC bulk crystal (B) under the surface layer (A) by annealing. On the other hand, in the present embodiment, as the step (a), the carbon atoms (C) are ion-implanted into the shallow surface layer (A) on the lower face side of the SiC bulk crystal (B). By the above step, excess carbon interstitials are introduced into the surface layer (A) on the lower face side.

Next, as the step (b), by heating the SiC bulk crystal (B), the carbon atoms (C) implanted into the surface layer (A) are diffused out from the surface layer (A) into the SiC bulk crystal (B) on the surface layer (A) and into the epitaxial layer thereon. During the annealing, carbon interstitials vanish together with carbon vacancies in the SiC bulk crystal (B), or other defects that are not electrically active are formed. As a result, the electrically active point defects that exist in the SiC bulk crystal (B) and the epitaxial layer are annealed out or made inactive.

In the present embodiment, the carbon atoms (C) are ion-implanted into the surface layer (A) on the lower face side of the SiC bulk crystal (B) and are diffused out into the SiC bulk crystal (B) on the surface layer (A) and into the epitaxial layer thereon. Consequently, in particular, the electrically active point defects can be sufficiently eliminated or reduced in a region from around the lower face of the SiC bulk crystal (B) and the epitaxial layer to inside thereof.

Figure 5:
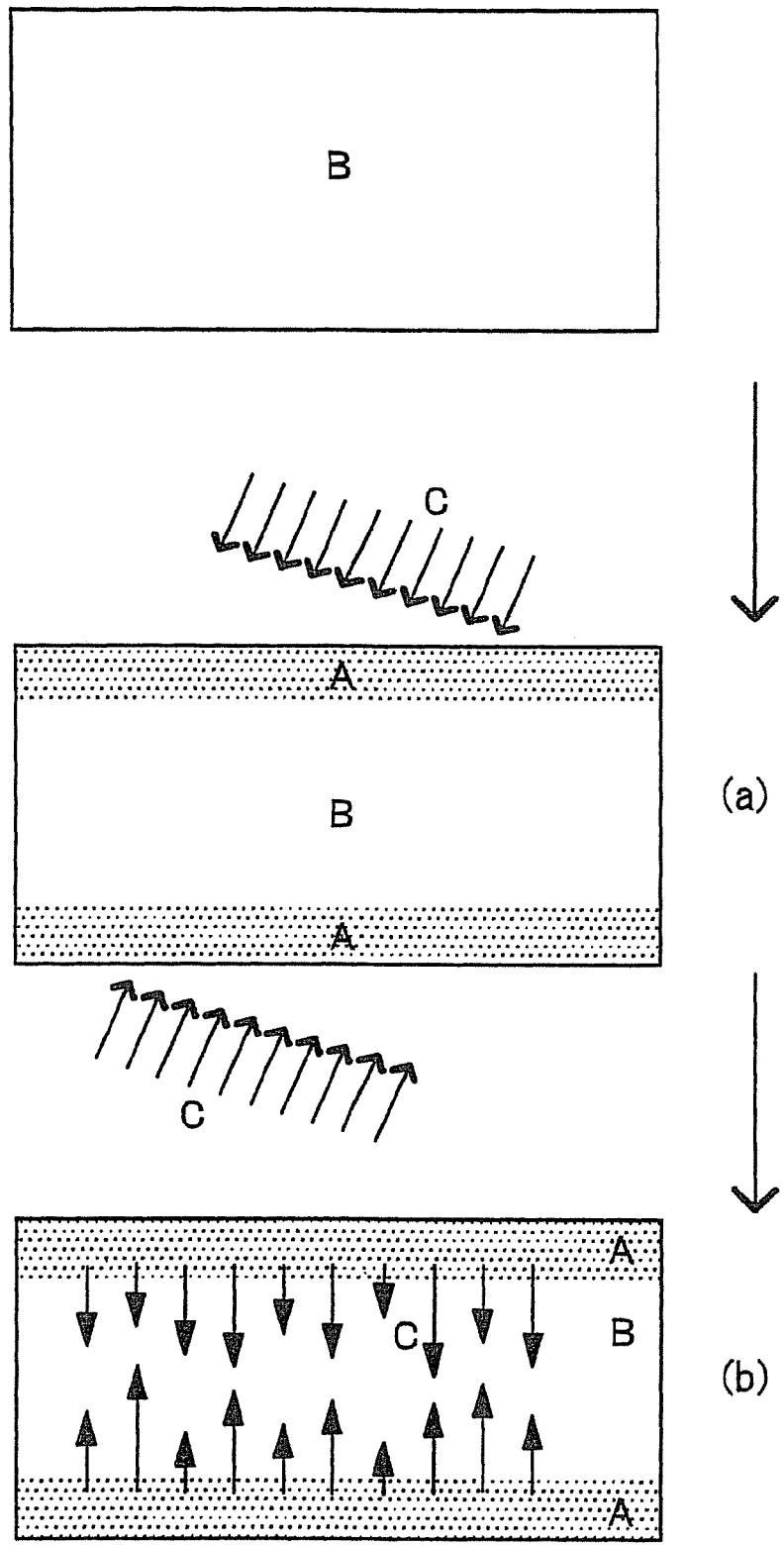
FIG. 5 is a schematic view showing the process of fabricating an SiC layer in which recombination centers are reduced while utilizing the method according to another preferred embodiment of the present invention.

FIG. 5 is a schematic view showing the process of fabricating an SiC layer in which recombination centers are reduced while utilizing the method according to another preferred embodiment of the present invention. In the present embodiment, similarly to FIGS. 3 and 4, an SiC bulk crystal (B) is used as an SiC crystal.

As to the step (a), the carbon atoms (C) are ion-implanted into the shallow surface layers (A) on the upper and lower face sides of the SiC bulk crystal (B). By the above step, excess carbon interstitials are introduced into the surface layers (A) on the upper and lower face sides.

Next, as to the step (b), by heating the SiC bulk crystal (B), the carbon atoms (c) implanted into the surface layers (A) are diffused out into the SiC bulk crystal (B) inside the surface layers (A). During the annealing, carbon interstitials vanish together with carbon vacancies in the SiC bulk crystal (B), or other defects that are not electrically active are formed. As a result, the electrically active point defects that exist in the SiC bulk crystal (B) are annealed out or made inactive.

In the present embodiment, the carbon atoms (C) are ion-implanted into the surface layers (A) on the both face sides of the SiC bulk crystal (B) and are diffused out into the SiC bulk crystal (B) inside the surface layers (A). Consequently, in particular, the electrically active point defects can be sufficiently eliminated or reduced in a region from around the both faces of the SiC bulk crystal (B) to inside thereof.

Figure 6:
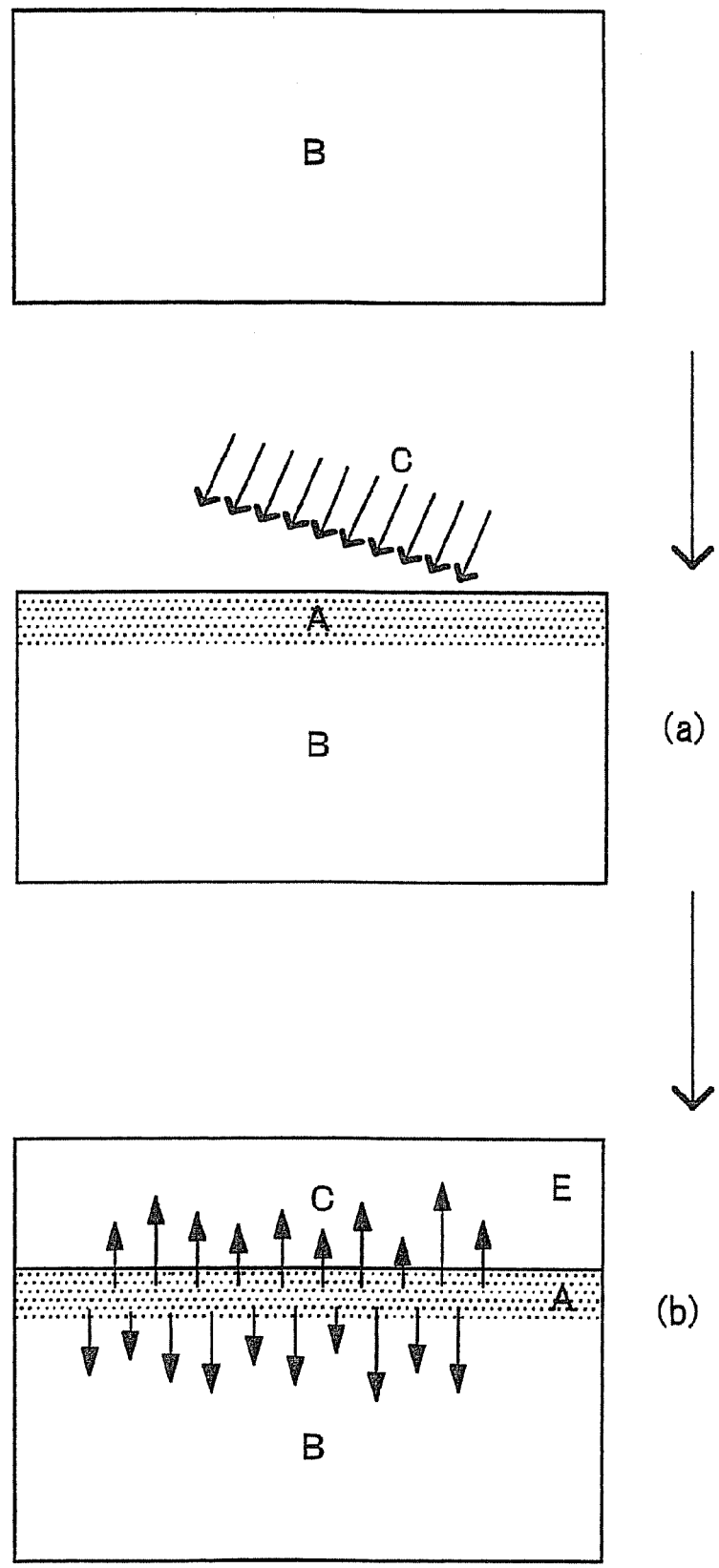
FIG. 6 is a schematic view showing the process of fabricating an SiC layer in which recombination centers are reduced while utilizing the method according to another preferred embodiment of the present invention.

FIG. 6 is a schematic view showing the process of fabricating an SiC layer in which recombination centers are reduced while utilizing the method according to another preferred embodiment of the present invention. In the present embodiment, as the step (a), the carbon atoms (C) are ion-implanted into the shallow surface layer (A) of the SiC bulk crystal (B). By the above step, excess carbon interstitials are introduced into the surface layer (A).

Next, as to the step (b), an SiC layer is grown upward from the edge face of the surface layer (A) into which the carbon atoms (C) have been implanted in order to form an epitaxial layer (E). By heating the SiC crystal, the carbon atoms (C) implanted into the surface layer (A) are diffused out from the surface layer (A) into the epitaxial layer (E). During the annealing, carbon interstitials vanish together with carbon vacancies in the epitaxial layer (E), or other defects that are not electrically active are formed.

At the same time, the carbon atoms (C) implanted into the surface layer (A) are also diffused out from the surface layer (A) into the SiC bulk crystal (B) on the opposite side of the epitaxial layer (E). By the above step, carbon interstitials vanish together with carbon vacancies in the SiC bulk crystal (B), particularly in a region around and inside the surface layer (A), or other defects that are not electrically active are formed.

By the above steps, the electrically active point defects that exist in the epitaxial layer (E) and the SiC bulk crystal (B) are annealed out or made inactive.

Annealing in the above step (b) can be carried out simultaneously with the step of growing the epitaxial layer (E) on the SiC bulk crystal (B) during heating in a CVD chamber.

Figure 7:
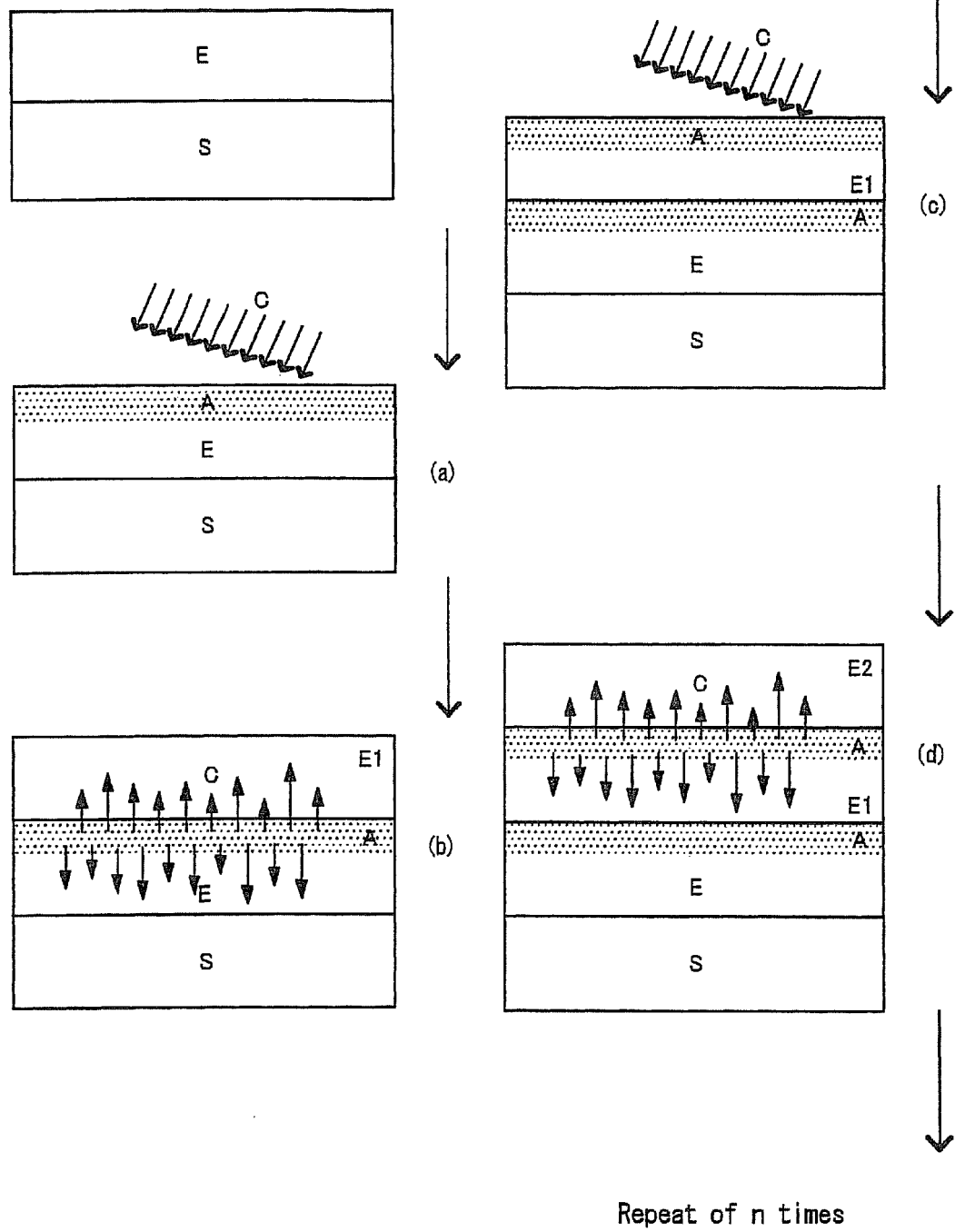
FIG. 7 is a schematic view showing the process of fabricating an SiC layer in which recombination centers are reduced while utilizing the method according to another preferred embodiment of the present invention.

FIG. 7 is a schematic view showing the process of fabricating an SiC layer in which recombination centers are reduced while utilizing the method according to another preferred embodiment of the present invention. In the present embodiment, first, there is prepared a wafer in which an epitaxial layer (E) has been grown from the surface of an SiC substrate (S) similarly to FIG. 1.

As to the step (a), carbon atoms (C) are ion-implanted into a shallow surface layer (A) of the epitaxial layer (E). By the above step, excess carbon interstitials are introduced into the surface layer (A).

Next, as the step (b), an SiC epitaxial layer (E1) is grown upward from the edge face of the surface layer (A) into which the carbon atoms (C) have been implanted. By heating the SiC crystal, the carbon atoms (C) implanted into the surface layer (A) are diffused out from the surface layer (A) into the epitaxial layer (E1). During the annealing, carbon interstitials vanish together with carbon vacancies in the epitaxial layer (E1), or other defects that are not electrically active are formed.

At the same time, the carbon atoms (C) implanted into the surface layer (A) are also diffused out from the surface layer (A) into the epitaxial layer (E) on the opposite side of the epitaxial layer (E1). During the annealing, carbon interstitials vanish together with carbon vacancies in the epitaxial layer (E), or other defects that are not electrically active are formed.

As to the step (c), carbon atoms (C) are then ion-implanted into a shallow surface layer (A) at the outside edge face of the epitaxial layer (E1). By the above step, excess carbon interstitials are introduced into the surface layer (A).

Next, as to the step (d), an SiC epitaxial layer (E2) is grown upward from the edge face of the surface layer (A) into which the carbon atoms (C) have been implanted. By heating the SiC crystal, the carbon atoms (C) implanted into the surface layer (A) are diffused out from the surface layer (A) into the epitaxial layer (E2). During the annealing, carbon interstitials vanish together with carbon vacancies in the epitaxial layer (E2), or other defects that are not electrically active are formed.

At the same time, the carbon atoms (C) implanted into the surface layer (A) are also diffused out from the surface layer (A) into the epitaxial layer (E1) on the opposite side of the epitaxial layer (E2). During the annealing, carbon interstitials vanish together with carbon vacancies in the epitaxial layer (E1), or other defects that are not electrically active are formed.

By the above steps, the electrically active point defects that exist in the epitaxial layers (E), (E1), and (E2), particularly the electrically active point defects that exist around the interface of the epitaxial layers (E) and (E1) and around the interface of the epitaxial layers (E1) and (E2) are annealed out or made inactive.

Annealing in the above steps (b) and (d) can be carried out simultaneously with the step of growing the epitaxial layer (E1) or the epitaxial layer (E2) during heating in a CVD chamber.

Moreover, a new epitaxial layer can also be formed on the epitaxial layer (E2) by repeating the above described operation. By carrying out the repeated operations of n times, epitaxial layers of n layers are further formed on the epitaxial layer (E). Consequently, there is obtained the epitaxial layers composed of a plurality of layers with less electrically active point defects.

Figure 16:
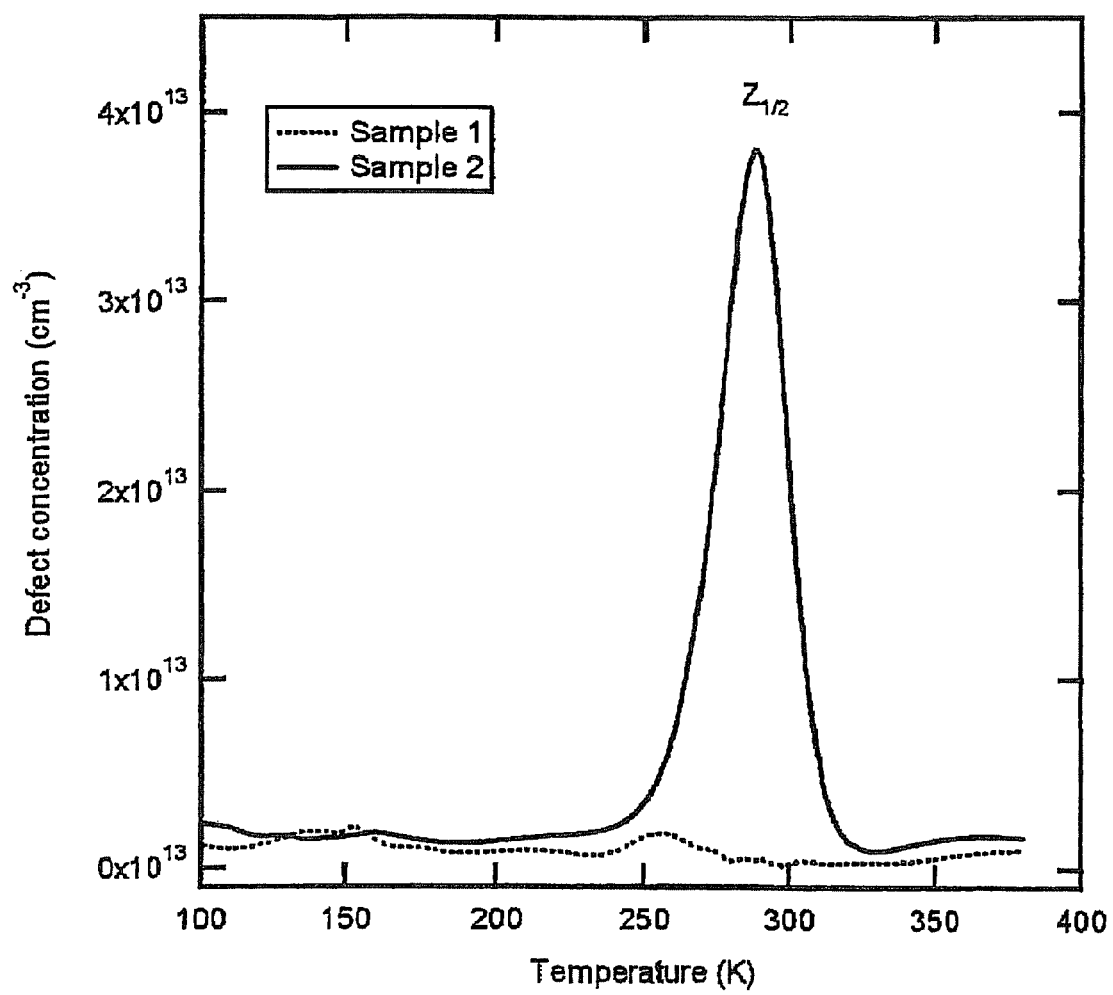
FIG. 16 illustrates the DLTS spectra of two SiC crystal samples, where the sample (1) was prepared according to the preferred embodiment of the present invention, and the sample (2) was prepared under the identical conditions as the sample (1) but omitting the step (a)

FIG. 16 illustrates the DLTS spectra of two SiC crystal samples, where the sample (1) was prepared according to the preferred embodiment of the present invention, and the sample (2) was prepared under the identical conditions as the sample (1) but omitting the step (a).

According to the sample (1), a signal from the Z1/Z2 has vanished completely, thus the traps have become electrically inactive. In addition, a signal from the EH6/7 has also vanished completely although this is not shown in the figure.

Figure 17:
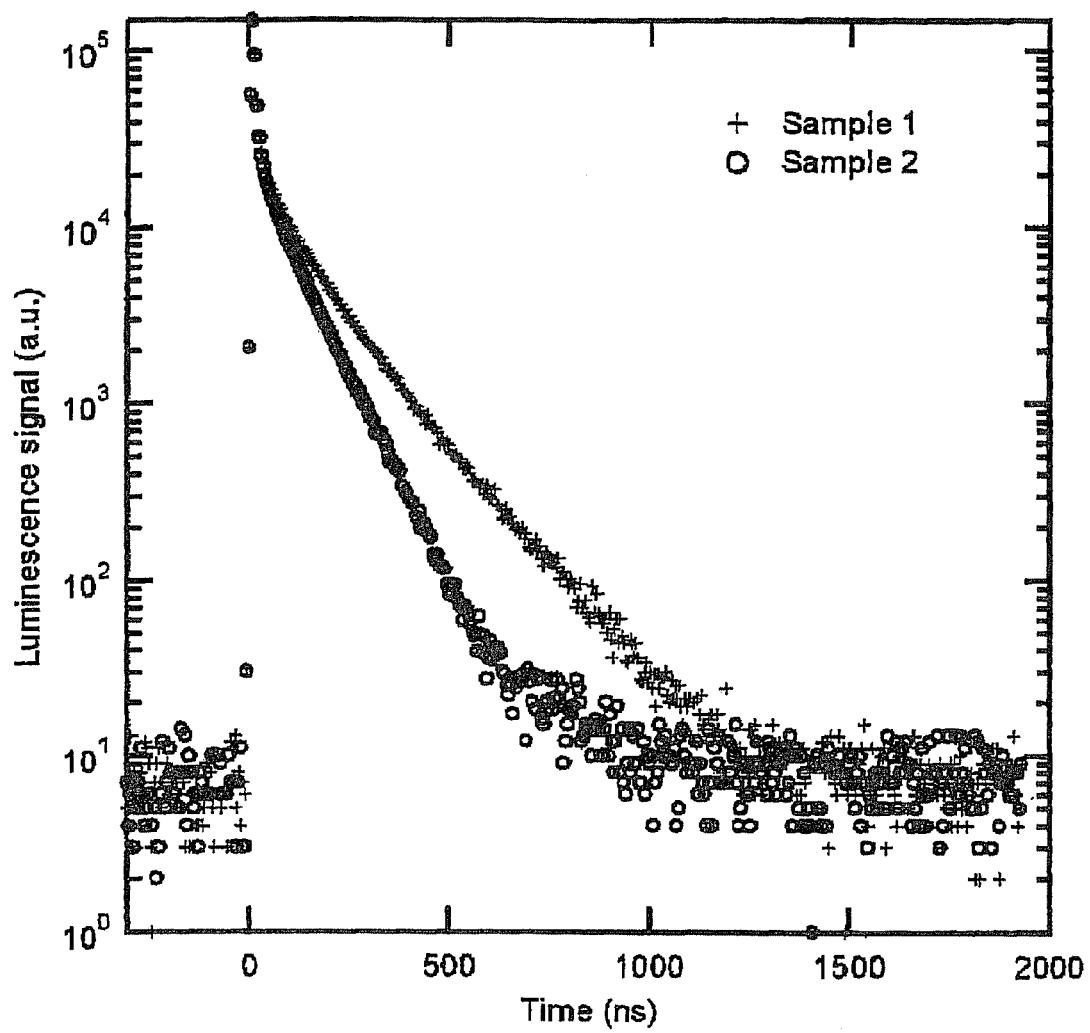
FIG. 17 illustrates the results of the measurement of the minority carrier lifetime by photoluminescence decay, where the sample (1) was prepared according to the preferred embodiment of the present invention, and the sample (2) was prepared under the identical conditions as the sample (1) but omitting the step (a)

FIG. 17 illustrates the results of the measurement of the minority carrier lifetime by photoluminescence decay, where the sample (1) was prepared according to the preferred embodiment of the present invention, and the sample (2) was prepared under the identical conditions as the sample (1) but omitting the step (a).

As shown in the figure, an increase of the minority carrier lifetime is evident in the sample (1).

Figure 18:
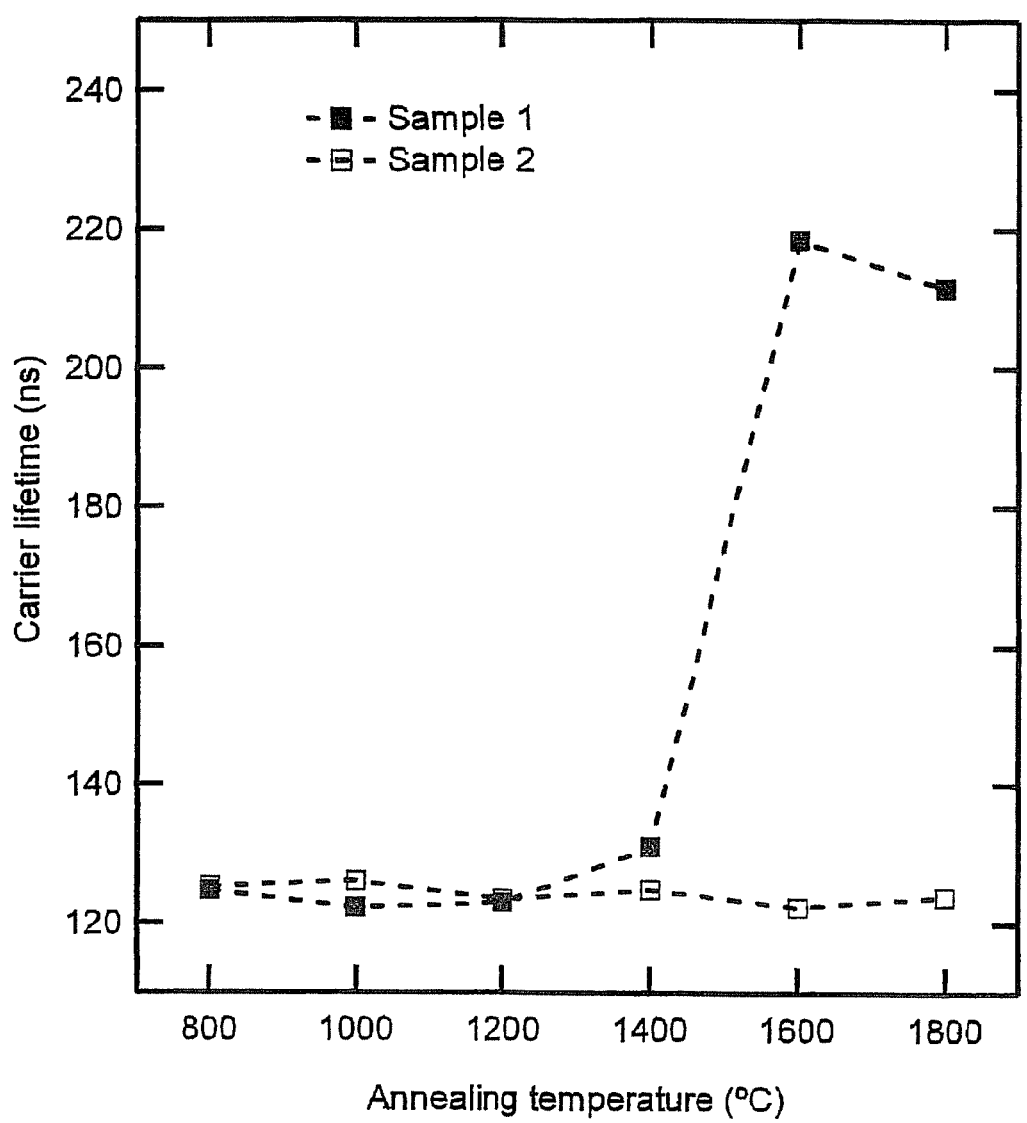
FIG. 18 illustrates the results of the measurement of the minority carrier lifetime by photoluminescence decay in the case where an annealing temperature is varied, where the sample (1) was prepared according to the preferred embodiment of the present invention, and the sample (2) was prepared under the identical conditions as the sample (1) but omitting the step (a)
Figure 19:
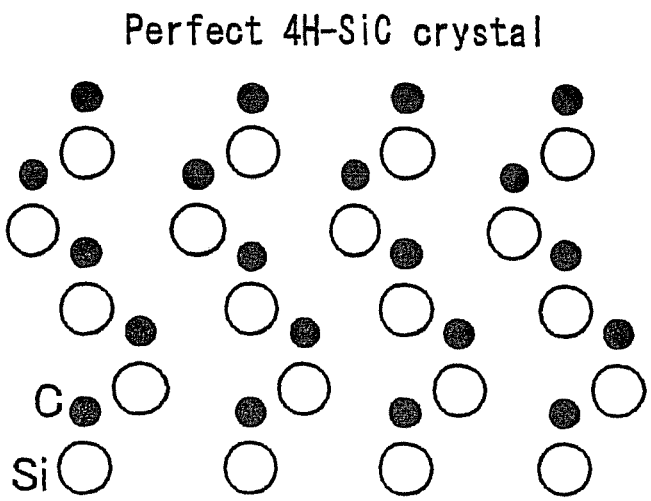
FIG. 19 is a schematic view showing the atomic configuration of Si and C in the perfect 4H—SiC crystal.
Figure 20:
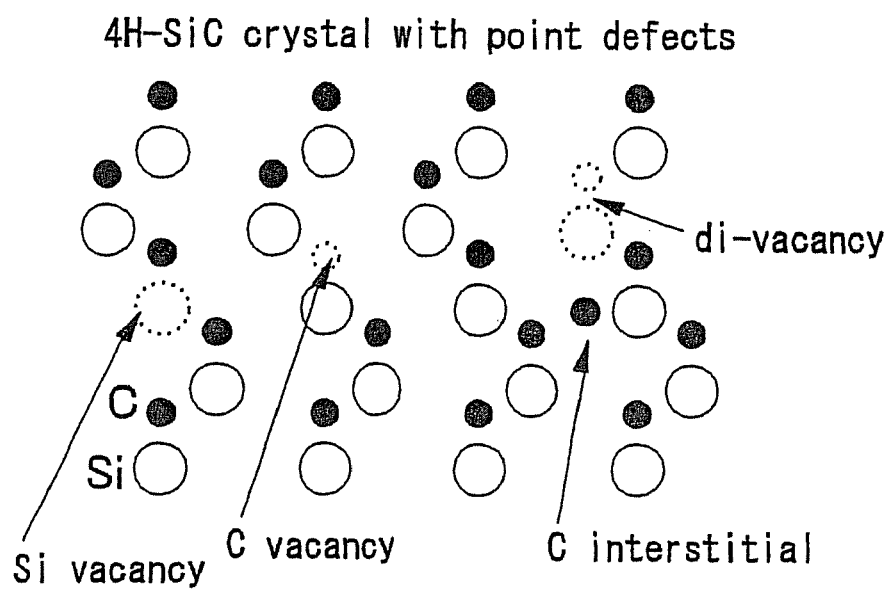
FIG. 20 is a schematic view showing the atomic configuration of Si and C in the 4H—SiC crystal and many kinds of point defects included therein.

FIG. 18 illustrates the results of the measurement of the minority carrier lifetime at different annealing temperatures by photoluminescence decay, where the sample (1) was prepared according to the preferred embodiment of the present invention, and the sample (2) was prepared under the identical conditions as the sample (1) but omitting the step (a). The annealing time was 30 minutes respectively.

As shown in the figure, an increase of the minority carrier lifetime is evident in the sample (1) by annealing above 1400° C. in the case where the annealing time is 30 minutes. It is thought that the annealing temperature can be lowered to approximately 1200° C. by further lengthening the annealing time. The upper limit of the annealing temperature is approximately 2200° C. that is equivalent to the sublimation temperature of SiC.

The method of improving the quality of an SiC crystal described in each of the above embodiments is applied to the production of SiC semiconductor devices of many kinds. In particular, the method is preferably applied to the production of bipolar type SiC semiconductor devices in which a reduction of electrically active point defects is particularly effective. A preferred embodiment of such a bipolar type SiC semiconductor device is described below.

Figure 8:
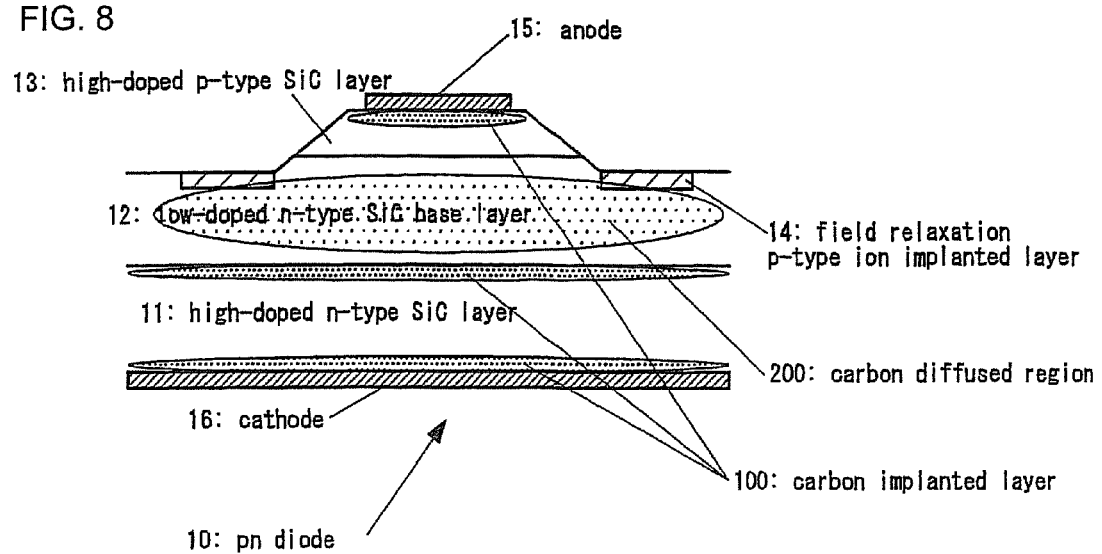
FIG. 8 is a schematic view showing the cross section of the device structure of an SiC pn diode according to a preferred embodiment of the present invention.

FIG. 8 is a schematic view showing the cross section of the device structure of an SiC pn diode according to a preferred embodiment of the present invention. The SiC pn diode 10 is provided with a high-doped p-type layer, a low-doped n-type base layer, and a high-doped n-type layer. The SiC crystal type, the suitable range of a detailed thickness and an impurity concentration of each layer, and the combination thereof in the device structure are well known to one of ordinary skill in the art.

As shown in the figure, in the SiC pn diode 10, a low-doped n-type SiC base layer 12 is formed on a high-doped n-type SiC layer 11 by the epitaxial growth method, and a high-doped p-type SiC layer 13 is formed thereon by the epitaxial growth method.

An anode 15 is formed on the surface of the high-doped p-type SiC layer 13, and a cathode 16 is formed on the surface of the high-doped n-type SiC layer 11. Numeral 14 represents a p-type ion implanted layer for relaxing an electric field concentration to improve a withstand voltage characteristics.

In the low-doped n-type SiC base layer 12, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the high-doped p-type SiC layer 13 or into the high-doped n-type SiC layer 11, into the low-doped n-type SiC base layer 12 by annealing.

According to such an SiC pn diode 10, the carbon diffused region 200 is formed in a conductivity modulation layer in which electrically active defects influence device characteristics, and electrically active point defects are reduced by combining the carbon interstitials and point defects. Consequently, the SiC pn diode 10 has excellent device characteristics.

Figure 9:
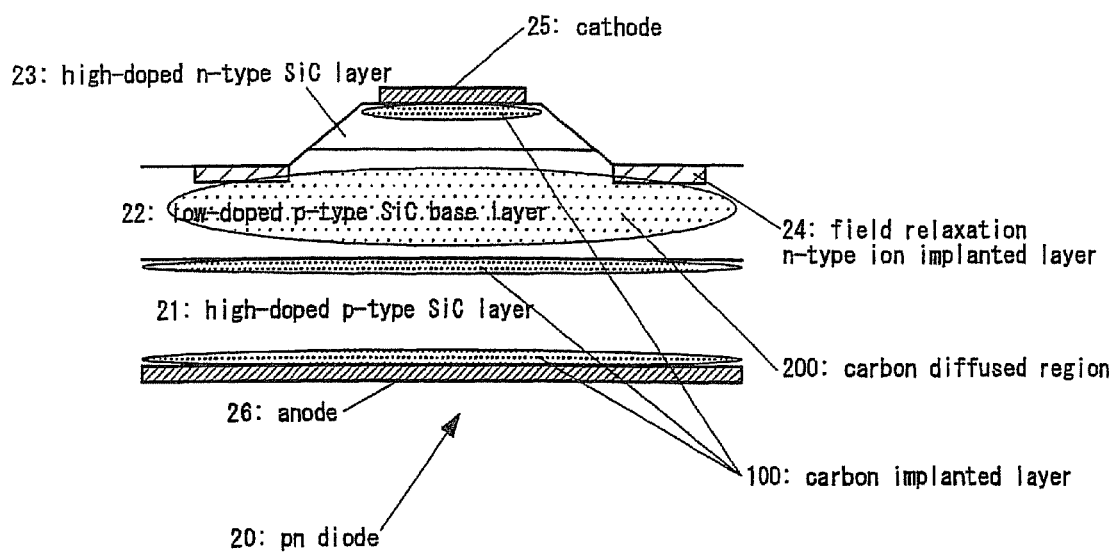
FIG. 9 is a schematic view showing the cross section of the device structure of an SiC pn diode according to another preferred embodiment of the present invention.

FIG. 9 is a schematic view showing the cross section of the device structure of an SiC pn diode according to another preferred embodiment of the present invention. In the SiC pn diode 20, a low-doped p-type SiC base layer 22 is formed on a high-doped p-type SiC layer 21 by the epitaxial growth method, and a high-doped n-type SiC layer 23 is formed thereon by the epitaxial growth method.

A cathode 25 is formed on the surface of the high-doped n-type SiC layer 23, and an anode 26 is formed on the surface of the high-doped p-type SiC layer 21. Numeral 24 represents an n-type ion implanted layer for relaxing an electric field concentration to improve a withstand voltage characteristics.

In the low-doped p-type SiC base layer 22, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the high-doped n-type SiC layer 23 or into the high-doped p-type SiC layer 21, into the low-doped p-type SiC base layer 22 by annealing.

According to such an SiC pn diode 20, the carbon diffused region 200 is formed in a conductivity modulation layer in which electrically active defects influence device characteristics, and electrically active point defects are reduced by combining the carbon interstitials and point defects. Consequently, the SiC pn diode 20 has excellent device characteristics.

Figure 10:
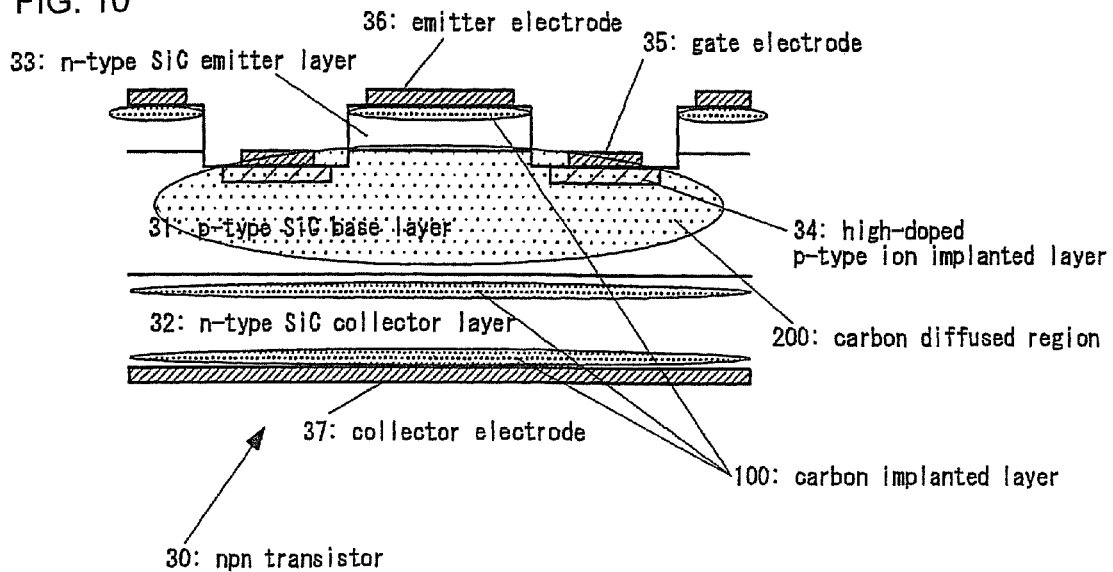
FIG. 10 is a schematic view showing the cross section of the device structure of an SiC npn transistor according to a preferred embodiment of the present invention.

FIG. 10 is a schematic view showing the cross section of the device structure of an SiC npn transistor according to a preferred embodiment of the present invention. The SiC npn transistor 30 is provided with an n-type emitter layer, a p-type base layer, and an n-type collector layer. The SiC crystal type, the suitable range of a detailed thickness and an impurity concentration of each layer, and the combination thereof in the device structure are well known to one of ordinary skill in the art.

As shown in the figure, in the SiC npn transistor 30, a p-type SiC base layer 31 is formed on an n-type SiC collector layer 32 by the epitaxial growth method, and an n-type SiC emitter layer 33 is formed thereon by the epitaxial growth method.

A high-doped p-type ion implanted layer 34 is formed around the surface of the p-type SiC base layer 31 and on the periphery of the n-type SiC emitter layer 33, and a gate electrode 35 is formed thereon.

An emitter electrode 36 is formed on the surface of the n-type SiC emitter layer 33, and a collector electrode 37 is formed on the surface of the n-type SiC collector layer 32.

In the p-type SiC base layer 31, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the n-type SiC emitter layer 33 or into the n-type SiC collector layer 32, into the p-type SiC base layer 31 by annealing.

According to such an SiC npn transistor 30, the carbon diffused region 200 is formed in a conductivity modulation layer in which electrically active defects influence device characteristics, and electrically active point defects are reduced by combining the carbon interstitials and point defects. Consequently, the SiC npn transistor 30 has excellent device characteristics.

Figure 11:
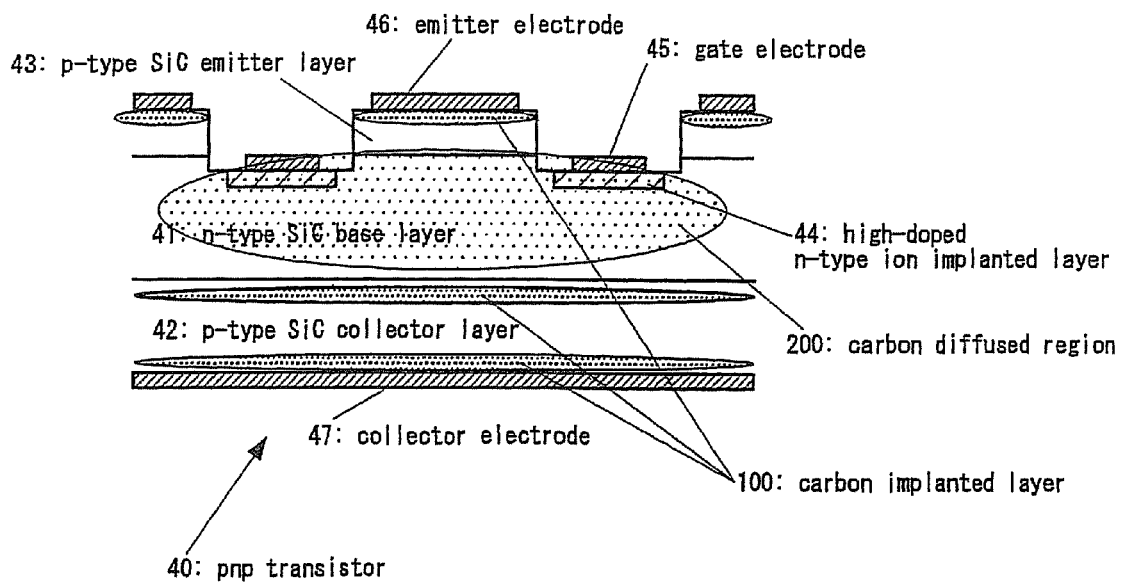
FIG. 11 is a schematic view showing the cross section of the device structure of an SiC pnp transistor according to a preferred embodiment of the present invention.

FIG. 11 is a schematic view showing the cross section of the device structure of an SiC pnp transistor according to a preferred embodiment of the present invention. In the SiC pnp transistor 40, an n-type SiC base layer 41 is formed on a p-type SiC collector layer 42 by the epitaxial growth method, and a p-type SiC emitter layer 43 is formed thereon by the epitaxial growth method.

A high-doped n-type ion implanted layer 44 is formed around the surface of the n-type SiC base layer 41 and on the periphery of the p-type SiC emitter layer 43, and a gate electrode 45 is formed thereon.

An emitter electrode 46 is formed on the surface of the p-type SiC emitter layer 43, and a collector electrode 47 is formed on the surface of the p-type SiC collector layer 42.

In the n-type SiC base layer 41, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the p-type SiC emitter layer 43 or into the p-type SiC collector layer 42, into the n-type SiC base layer 41 by annealing.

According to such an SiC pnp transistor 40, the carbon diffused region 200 is formed in a conductivity modulation layer in which electrically active defects influence device characteristics, and electrically active point defects are reduced by combining the carbon interstitials and point defects. Consequently, the SiC pnp transistor 40 has excellent device characteristics.

Figure 12:
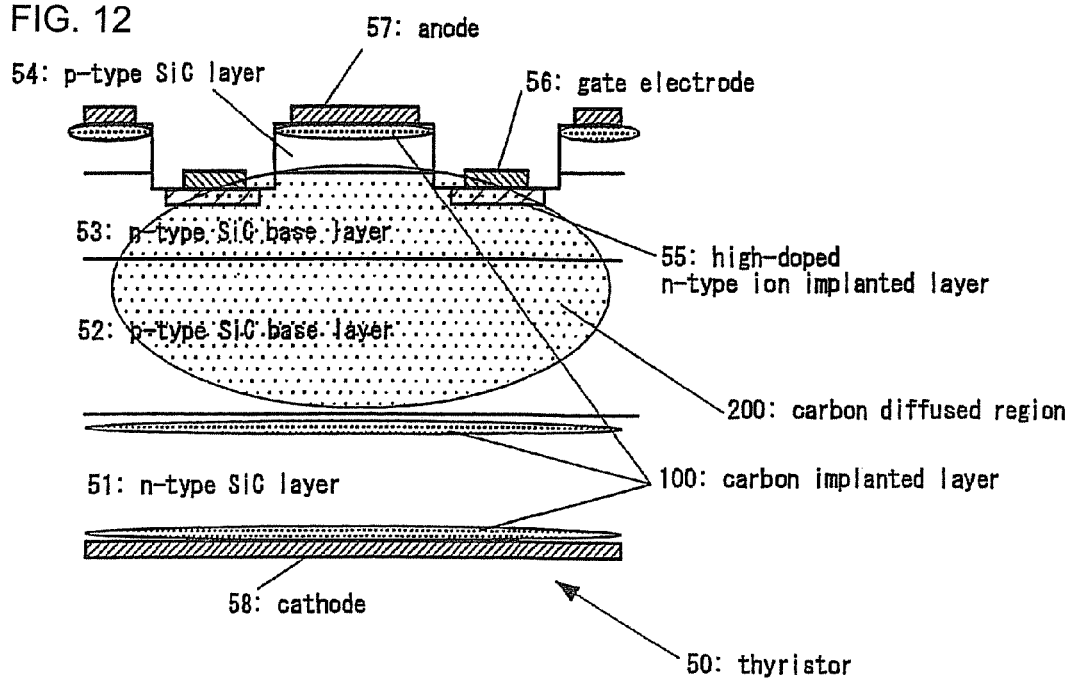
FIG. 12 is a schematic view showing the cross section of the device structure of an SiC thyristor according to a preferred embodiment of the present invention.

FIG. 12 is a schematic view showing the cross section of the device structure of an SiC thyristor according to a preferred embodiment of the present invention. The SiC thyristor 50 is an SiC gate turn-off thyristor that is provided with a p-type layer, an n-type base layer, a p-type base layer, and an n-type layer. The SiC crystal type, the suitable range of a detailed thickness and an impurity concentration of each layer, and the combination thereof in the device structure are well known to one of ordinary skill in the art.

As shown in the figure, in the SiC thyristor 50, a p-type SiC base layer 52 is formed on an n-type SiC layer 51 by the epitaxial growth method, an n-type SiC base layer 53 is formed thereon by the epitaxial growth method, and a p-type SiC layer 54 is formed thereon by the epitaxial growth method.

A high-doped n-type ion implanted layer 55 is formed around the surface of the n-type SiC base layer 53 and on the periphery of the p-type SiC layer 54, and a gate electrode 56 is formed thereon.

An anode 57 is formed on the surface of the p-type SiC layer 54, and a cathode 58 is formed on the surface of the n-type SiC layer 51.

In the p-type SiC base layer 52 and the n-type SiC base layer 53, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the p-type SiC layer 54 or into the n-type SiC layer 51, into the p-type SiC base layer 52 and the n-type SiC base layer 53 by annealing.

According to such an SiC thyristor 50, the carbon diffused region 200 is formed in a conductivity modulation layer in which electrically active defects influence device characteristics, and electrically active point defects are reduced by combining the carbon interstitials and point defects. Consequently, the SiC thyristor 50 has excellent device characteristics.

Figure 13:
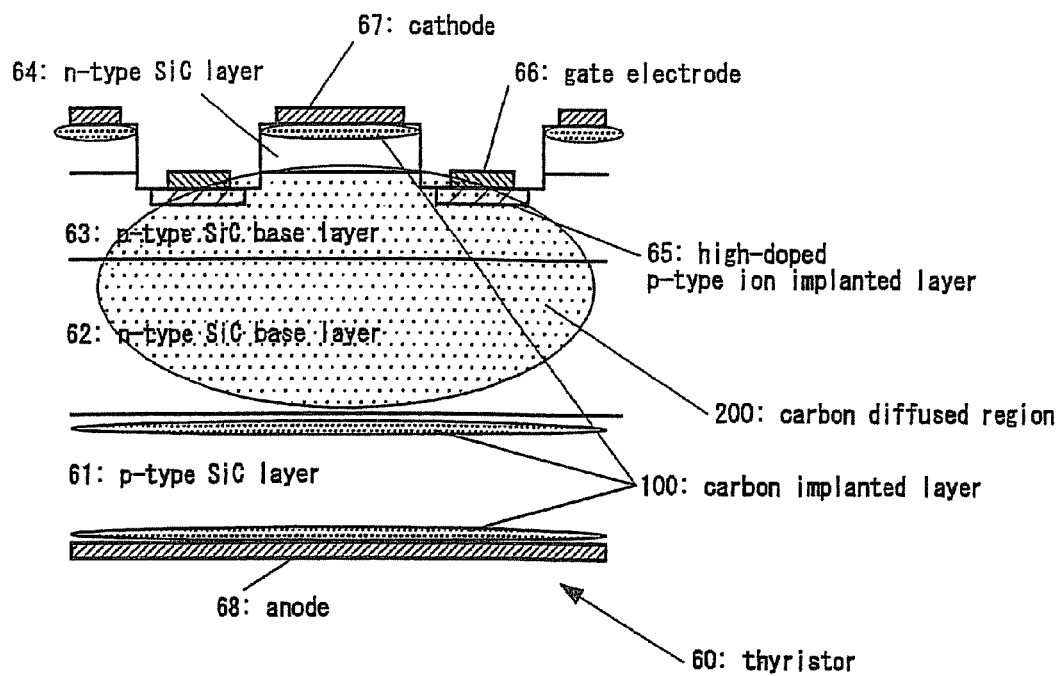
FIG. 13 is a schematic view showing the cross section of the device structure of an SiC thyristor according to a preferred embodiment of the present invention.

FIG. 13 is a schematic view showing the cross section of the device structure of an SiC thyristor according to a preferred embodiment of the present invention. In the SiC thyristor 60, an n-type SiC base layer 62 is formed on a p-type SiC layer 61 by the epitaxial growth method, a p-type SiC base layer 63 is formed thereon by the epitaxial growth method, and an n-type SiC layer 64 is formed thereon by the epitaxial growth method.

A high-doped p-type ion implanted layer 65 is formed around the surface of the p-type SiC base layer 63 and on the periphery of the n-type SiC layer 64, and a gate electrode 66 is formed thereon.

A cathode 67 is formed on the surface of the n-type SiC layer 64, and an anode 68 is formed on the surface of the p-type SiC layer 61.

In the n-type SiC base layer 62 and the p-type SiC base layer 63, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the n-type SiC layer 64 or into the p-type SiC layer 61, into the n-type SiC base layer 62 and the p-type SiC base layer 63 by annealing.

According to such an SiC thyristor 60, the carbon diffused region 200 is formed in a conductivity modulation layer in which electrically active defects influence device characteristics, and electrically active point defects are reduced by combining the carbon interstitials and point defects. Consequently, the SiC thyristor 60 has excellent device characteristics.

Figure 14:
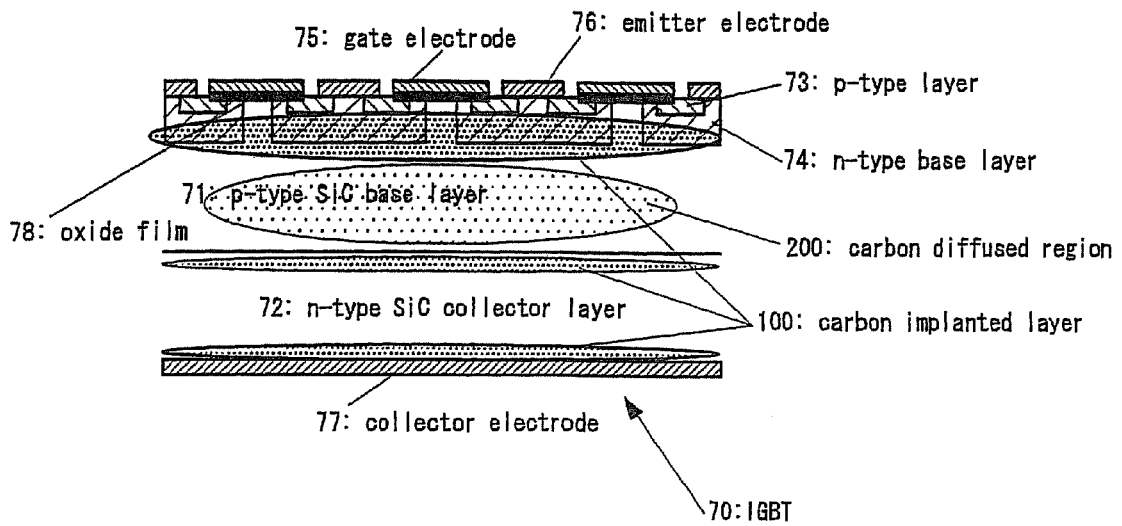
FIG. 14 is a schematic view showing the cross section of the device structure of an SiC IGBT according to a preferred embodiment of the present invention.

FIG. 14 is a schematic view showing the cross section of the device structure of an SiC IGBT according to a preferred embodiment of the present invention. The SiC IGBT 70 is provided with a p-type layer, an n-type base layer, a p-type base layer, and an n-type collector layer. The SiC crystal type, the suitable range of a detailed thickness and an impurity concentration of each layer, and the combination thereof in the device structure are well known to one of ordinary skill in the art.

As shown in the figure, in the SiC IGBT 70, a p-type SiC base layer 71 is formed on an n-type SiC collector layer 72 by the epitaxial growth method.

A gate electrode 75 is formed on the p-type SiC base layer 71 through an oxide film 78 as a gate insulating film. On the other hand, an n-type base layer 74 is formed above the p-type SiC base layer 71, and an emitter electrode 76 is formed thereon. The n-type base layer 74 is formed in the range from the oxide film 78 under the gate electrode 75 to the emitter electrode 76, and a p-type layer 73 is formed in the range from the oxide film 78 to the emitter electrode 76 inside the n-type base layer 74.

A collector electrode 77 is formed on the surface of the n-type SiC collector layer 72.

In the p-type SiC base layer 71, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the p-type SiC base layer 71 on the n-type base layer 74 side or into the n-type SiC collector layer 72, into the p-type SiC base layer 71 by annealing.

According to such an SiC IGBT 70, the carbon diffused region 200 is formed in a conductivity modulation layer in which electrically active defects influence device characteristics, and electrically active point defects are reduced by combining the carbon interstitials and point defects. Consequently, the SiC IGBT 70 has excellent device characteristics.

Figure 15:
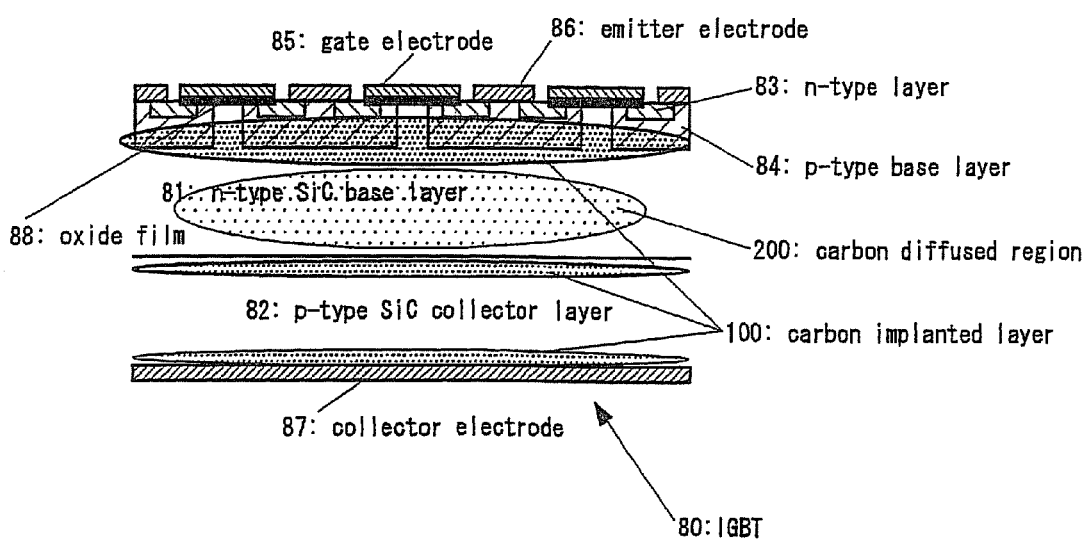
FIG. 15 is a schematic view showing the cross section of the device structure of an SiC IGBT according to a preferred embodiment of the present invention.

FIG. 15 is a schematic view showing the cross section of the device structure of an SiC IGBT according to a preferred embodiment of the present invention. In the SiC IGBT 80, an n-type SiC base layer 81 is formed on a p-type SiC collector layer 82 by the epitaxial growth method.

A gate electrode 85 is formed on the n-type SiC base layer 81 through an oxide film 88 as a gate insulating film. On the other hand, a p-type base layer 84 is formed above the n-type SiC base layer 81, and an emitter electrode 86 is formed thereon. The p-type base layer 84 is formed in the range from the oxide film 88 under the gate electrode 85 to the emitter electrode 86, and an n-type layer 83 is formed in the range from the oxide film 88 to the emitter electrode 86 inside the p-type base layer 84.

A collector electrode 87 is formed on the surface of the p-type SiC collector layer 82.

In the n-type SiC base layer 81, by applying any of the methods shown in FIGS. 1 to 7, there is formed a carbon diffused region 200 by diffusing out carbon interstitials in a carbon implanted layer 100, which has been formed by ion-implanting carbon atoms (C) into a region around the surface of the n-type SiC base layer 81 on the p-type base layer 84 side or into the p-type SiC collector layer 82, into the n-type SiC base layer 81 by annealing.

According to such an SiC IGBT 80, the carbon diffused region 200 is formed in a conductivity modulation layer in which electrically active defects influence device characteristics, and electrically active point defects are reduced by combining the carbon interstitials and point defects. Consequently, the SiC IGBT 80 has excellent device characteristics.

The present invention is of course not in any way restricted to the preferred embodiment described above, but many possible modifications and changes thereof will be apparent to one of ordinary skill in the art.

It is possible to improve the quality of the entire SiC layer or only a region thereof.

The definition of "layer" as used herein is to be interpreted broadly and comprises all types of volume extensions and shapes.

The word "crystal" as used herein means an excellent periodicity of the lattice in the three dimensions over greater regions, i.e. typical polycrystalline structures are excluded.

The invention claimed is:

1. A method for improving the quality of an SiC crystal by eliminating or reducing carrier trapping centers in as-grown SiC crystal layer comprising the steps of:
    (a) carrying out ion implantation of carbon atoms, silicon atoms, hydrogen atoms, or helium atoms into a shallow surface layer of the SiC crystal layer to introduce carbon interstitials into the surface layer, wherein carrying out implantation further comprises selecting a dose of atoms in such a manner that a concentration of the introduced carbon interstitials exceeds that of electrically active point defects in the grown layer produced in step (b), and
    (b) growing the SiC layer upward from the edge face of the surface layer into which the carbon interstitials have been introduced, and diffusing out the carbon interstitials that have been introduced into the surface layer from the surface layer into the grown layer and combining the carbon interstitials and point defects to make the electrically active point defects in the grown layer inactive.

2. The method as defined in claim 1, wherein the ion implantation energy of atoms is in the range from 10 KeV to 10 MeV in the step (a).

3. The method as defined in claim 1, wherein a temperature of the SiC crystal during ion implantation is in the range from 10 to 1700° C. in the step (a).

4. The method as defined in claim 1, wherein an SiC wafer provided with an epitaxial layer is used in the steps (a) and (b).

5. The method as defined in claim 1, wherein an SiC bulk crystal is used in the steps (a) and (b).

6. The method as defined in claim 1, wherein a wafer sliced from an SiC bulk crystal is used in the steps (a) and (b).

7. The method as defined in claim 1, wherein an SiC monocrystal wafer is used in the steps (a) and (b) that has been formed as an epitaxial layer by a process in which after an SiC epitaxial layer is obtained using a wafer sliced from an SiC bulk crystal as a substrate, the substrate portion is removed.

8. The method as defined in claim 1, wherein an SiC wafer having a combination of any of n-type and p-type epitaxial layers is used in the steps (a) and (b).

9. A method for improving the quality of an SiC crystal by eliminating or reducing carrier trapping centers in as-grown SiC crystal layer comprising the steps of:
    (a) carrying out ion implantation of carbon atoms, silicon atoms, hydrogen atoms, or helium atoms into a shallow surface layer of the SiC crystal layer to introduce interstitials and vacancies or stress into the surface layer, wherein carrying out implantation further comprises selecting a dose of atoms in such a manner that a concentration of the introduced carbon interstitials exceeds that of electrically active point defects in the grown layer produced in step (b), and
    (b) growing the SiC layer upward from the edge face of the surface layer into which the interstitials and vacancies or stress have been introduced, and diffusing out the interstitials and vacancies that have been introduced into the surface layer from the surface layer into the grown layer and combining the interstitials or vacancies with point defects, or migrating the point defects in the bulk layer towards the surface layer by utilizing the stress that have been induced into the surface layer, to thereby make the electrically active point defects in the grown layer inactive or vanish.

* * * * *